(12) United States Patent
Sakamoto

(10) Patent No.: US 9,837,342 B2
(45) Date of Patent: Dec. 5, 2017

(54) MULTILAYER WIRING BOARD AND METHOD FOR MANUFACTURING SAME

(71) Applicant: IBIDEN CO., LTD., Ogaki-shi (JP)

(72) Inventor: Hajime Sakamoto, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/809,455

(22) Filed: Jul. 27, 2015

(65) Prior Publication Data

US 2016/0027725 A1    Jan. 28, 2016

(30) Foreign Application Priority Data

Jul. 25, 2014   (JP) .................. 2014-151520

(51) Int. Cl.
| | | |
|---|---|---|
| *H05K 1/00* | (2006.01) | |
| *H01L 23/498* | (2006.01) | |
| *H01L 23/367* | (2006.01) | |
| *H01L 21/683* | (2006.01) | |

(52) U.S. Cl.
CPC .... *H01L 23/49822* (2013.01); *H01L 21/6835* (2013.01); *H01L 21/6836* (2013.01); *H01L 23/367* (2013.01); *H01L 23/49827* (2013.01); *H01L 23/49833* (2013.01); *H01L 2221/68318* (2013.01); *H01L 2221/68331* (2013.01); *H01L 2221/68345* (2013.01); *H01L 2221/68359* (2013.01); *H01L 2221/68381* (2013.01); *H01L 2224/16227* (2013.01); *H01L 2924/15313* (2013.01)

(58) Field of Classification Search
CPC .. H05K 3/10; H05K 3/26; H05K 3/40; H05K 3/46; H05K 1/02; H05K 1/11; H01L 21/02; H01L 21/48; H01L 21/60; H01L 23/00; H01L 23/02; H01L 23/34; H01L 23/48; H01L 23/52
USPC ........ 174/252, 267; 257/678, 693, 712, 774, 257/778; 361/767; 438/106, 113, 653
See application file for complete search history.

(56) References Cited

U.S. PATENT DOCUMENTS

| | | | |
|---|---|---|---|
| 5,258,648 A | * | 11/1993 | Lin .................... G01R 31/2863 257/747 |
| 5,532,094 A | | 7/1996 | Arimura |

(Continued)

FOREIGN PATENT DOCUMENTS

| | | |
|---|---|---|
| JP | 2011-159855 | 8/2011 |
| JP | 2013-214578 A | 10/2013 |

*Primary Examiner* — Xiaoliang Chen
(74) *Attorney, Agent, or Firm* — Oblon, McClelland, Maier & Neustadt, L.L.P.

(57) ABSTRACT

A multilayer wiring board includes a main wiring board which mounts a semiconductor component on a surface of the main wiring board, and a wiring structure body which is mounted to the main wiring board and is formed to be electrically connected to the semiconductor component. The wiring structure body includes conductive pads formed on a first side of the wiring structure body, a heat radiation component formed on a second side of the wiring structure body on the opposite side with respect to the first side, an insulation layer positioned between the conductive pads and the heat radiation component, and via conductors formed in the insulation layer such that each of the via conductors has a diameter which increases from the first side toward the second side of the wiring structure body.

20 Claims, 22 Drawing Sheets

(56) References Cited

U.S. PATENT DOCUMENTS

| | | | |
|---|---|---|---|
| 6,190,834 B1* | 2/2001 | Narahara | C08F 290/14 430/280.1 |
| 6,281,446 B1 | 8/2001 | Sakamoto | |
| 6,379,159 B1* | 4/2002 | Mune | H01L 21/486 257/E23.067 |
| 6,687,985 B2 | 2/2004 | Sakamoto | |
| 6,818,989 B2* | 11/2004 | Higuchi | H01L 23/13 257/666 |
| 6,952,049 B1 | 10/2005 | Ogawa | |
| 2001/0051393 A1* | 12/2001 | Ogino | H01L 23/49816 438/106 |
| 2003/0089868 A1* | 5/2003 | Ito | H01L 23/525 251/100 |
| 2004/0183187 A1* | 9/2004 | Yamasaki | H01L 21/76898 257/700 |
| 2005/0255303 A1 | 11/2005 | Sawatari | |
| 2006/0001179 A1* | 1/2006 | Fukase | H01L 23/147 257/778 |
| 2006/0087015 A1* | 4/2006 | Yuan | H01L 23/3128 257/678 |
| 2007/0267740 A1* | 11/2007 | Khan | H01L 23/3128 257/712 |
| 2010/0213600 A1* | 8/2010 | Lau | H01L 23/055 257/693 |
| 2011/0240357 A1 | 10/2011 | Kariya | |
| 2012/0319254 A1* | 12/2012 | Kikuchi | H01L 23/5389 257/659 |
| 2013/0016477 A1* | 1/2013 | Yokoya | H01L 23/36 361/719 |
| 2013/0026632 A1* | 1/2013 | Kikuchi | H01L 21/6835 257/753 |
| 2013/0027895 A1* | 1/2013 | Hayashi | H01L 23/145 361/760 |
| 2013/0119555 A1* | 5/2013 | Sundaram | H01L 21/486 257/774 |
| 2013/0256000 A1 | 10/2013 | Terui | |
| 2013/0258625 A1 | 10/2013 | Terui | |
| 2014/0347837 A1* | 11/2014 | Kariya | H05K 3/4682 361/767 |
| 2015/0096798 A1* | 4/2015 | Uzoh | H01L 25/00 174/267 |
| 2015/0097284 A1* | 4/2015 | Uzoh | H01L 23/49811 257/737 |
| 2015/0145116 A1* | 5/2015 | Uzoh | H01L 24/10 257/712 |
| 2015/0145140 A1* | 5/2015 | Haba | H01L 21/6835 257/774 |
| 2015/0145141 A1* | 5/2015 | Uzoh | H01L 23/5384 257/774 |
| 2015/0255364 A1* | 9/2015 | Gao | H01L 23/481 257/774 |
| 2015/0255429 A1* | 9/2015 | Katkar | H01L 25/0657 257/712 |
| 2015/0270209 A1* | 9/2015 | Woychik | H01L 21/52 257/774 |
| 2015/0371938 A1* | 12/2015 | Katkar | H01L 25/50 257/774 |

* cited by examiner

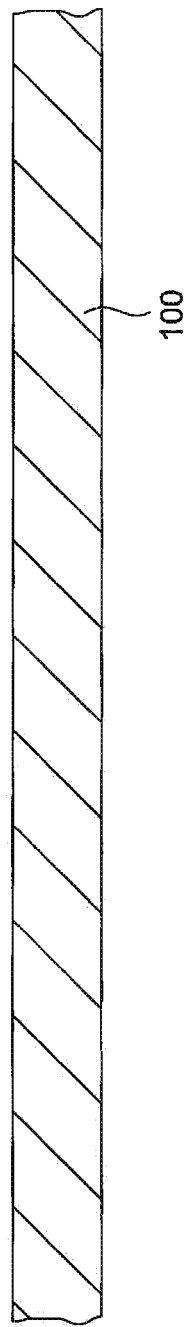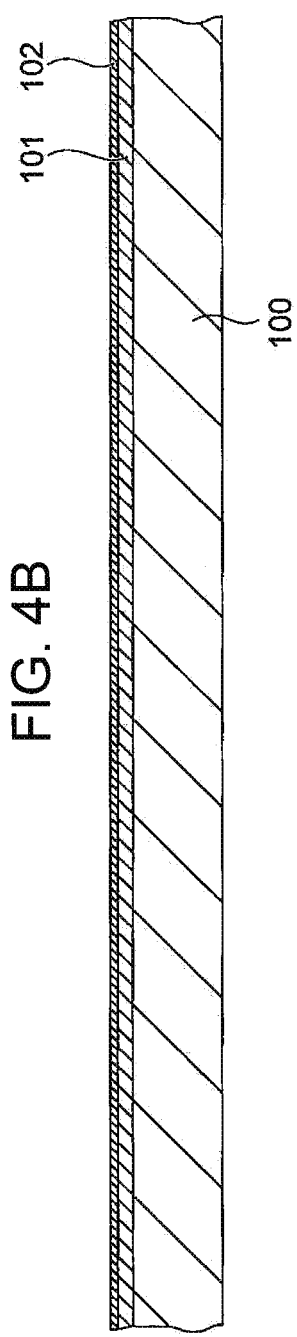

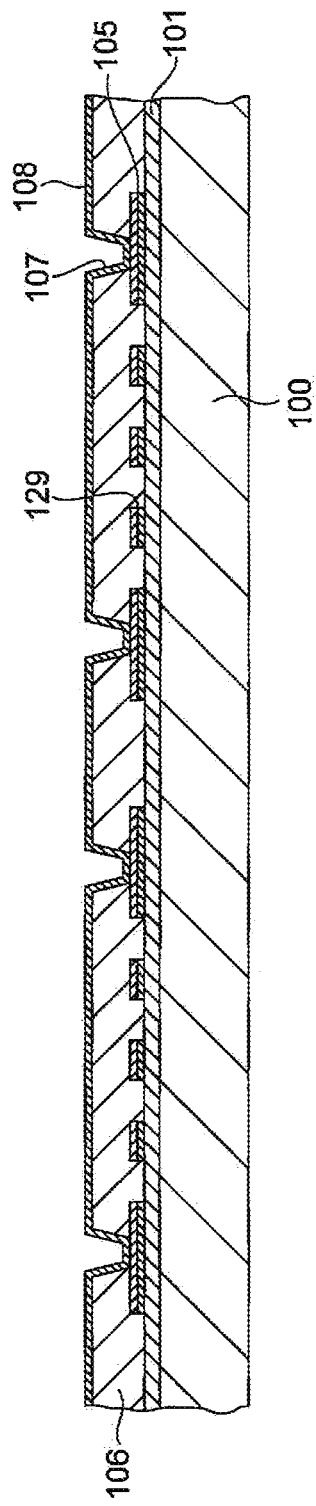
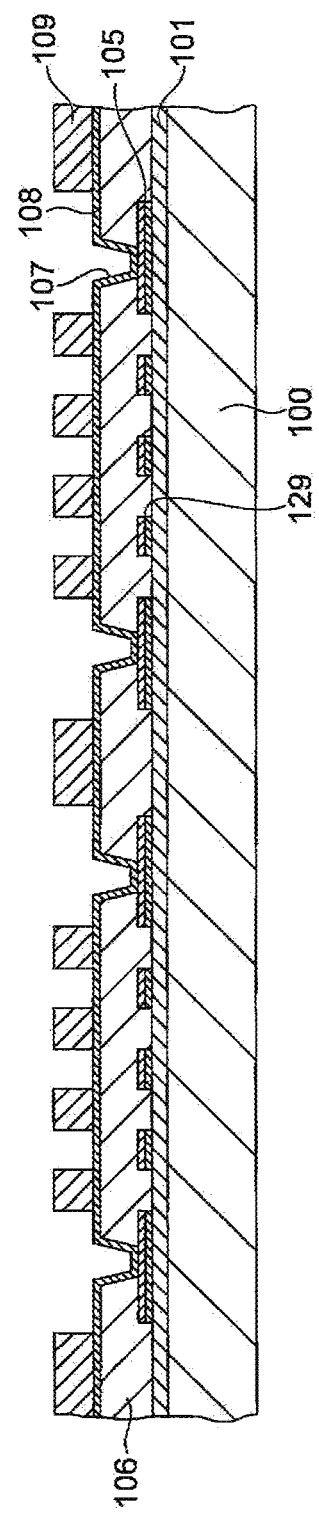

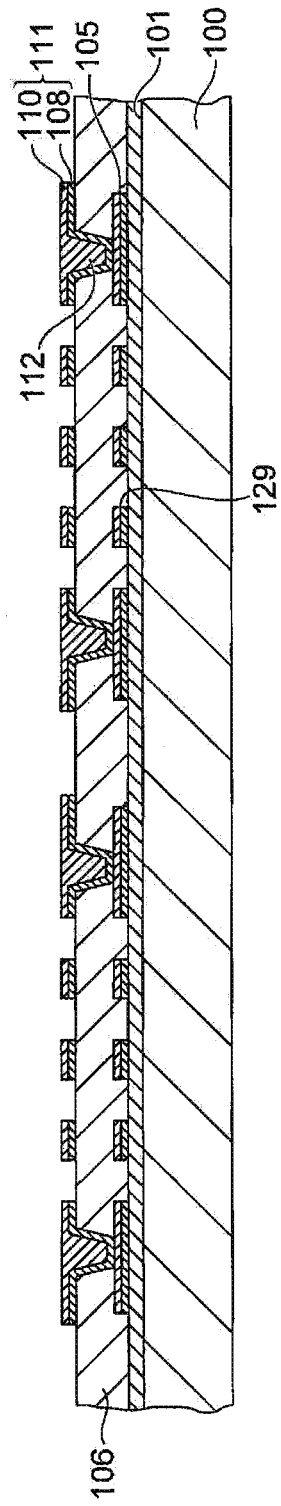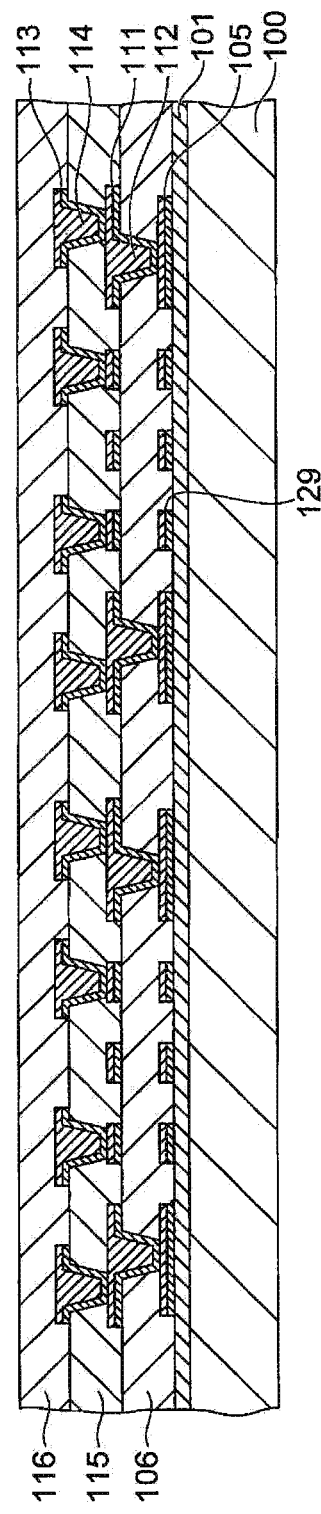

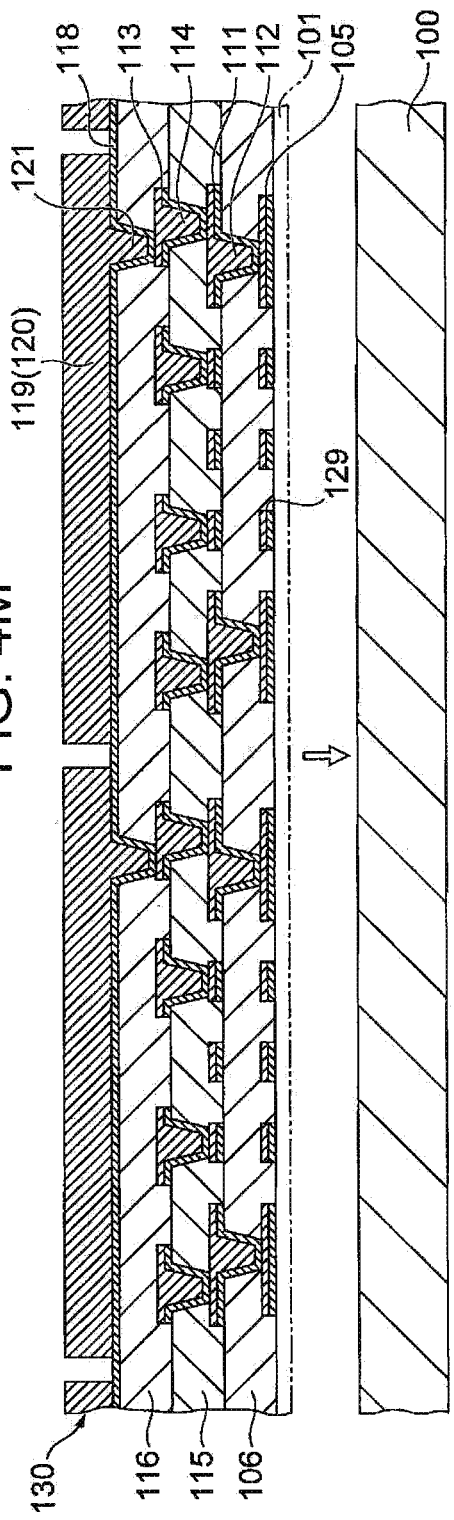
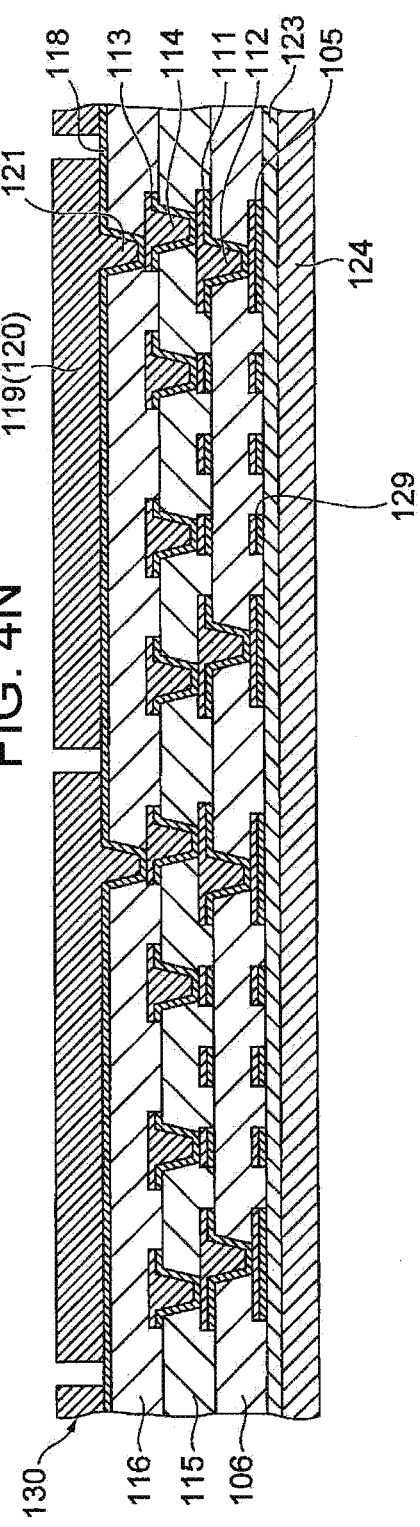
FIG. 4M
FIG. 4N

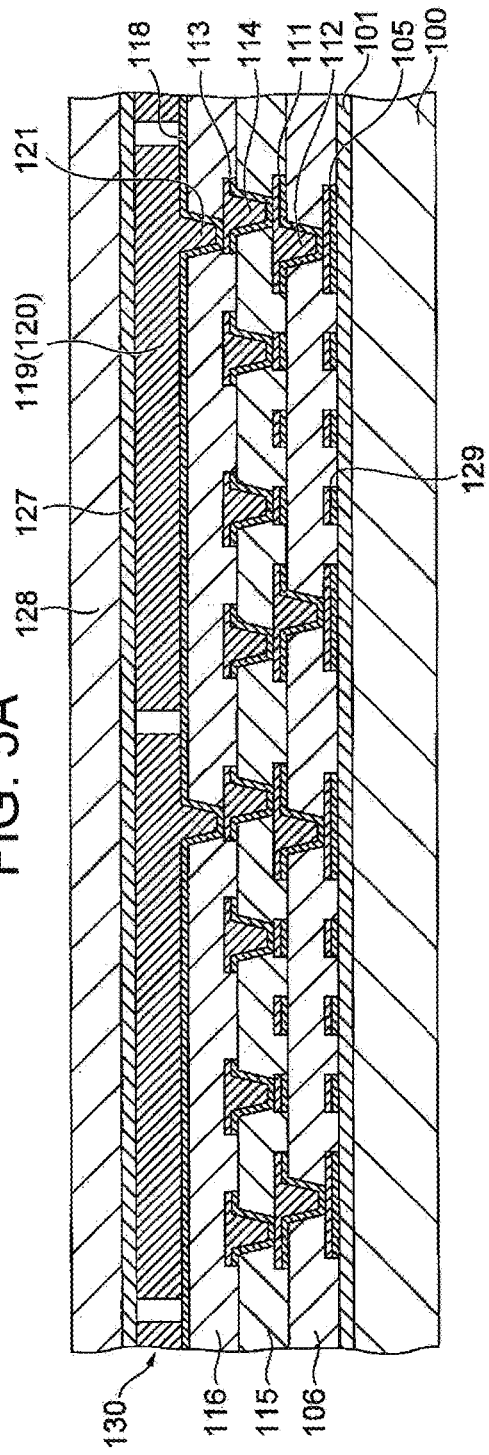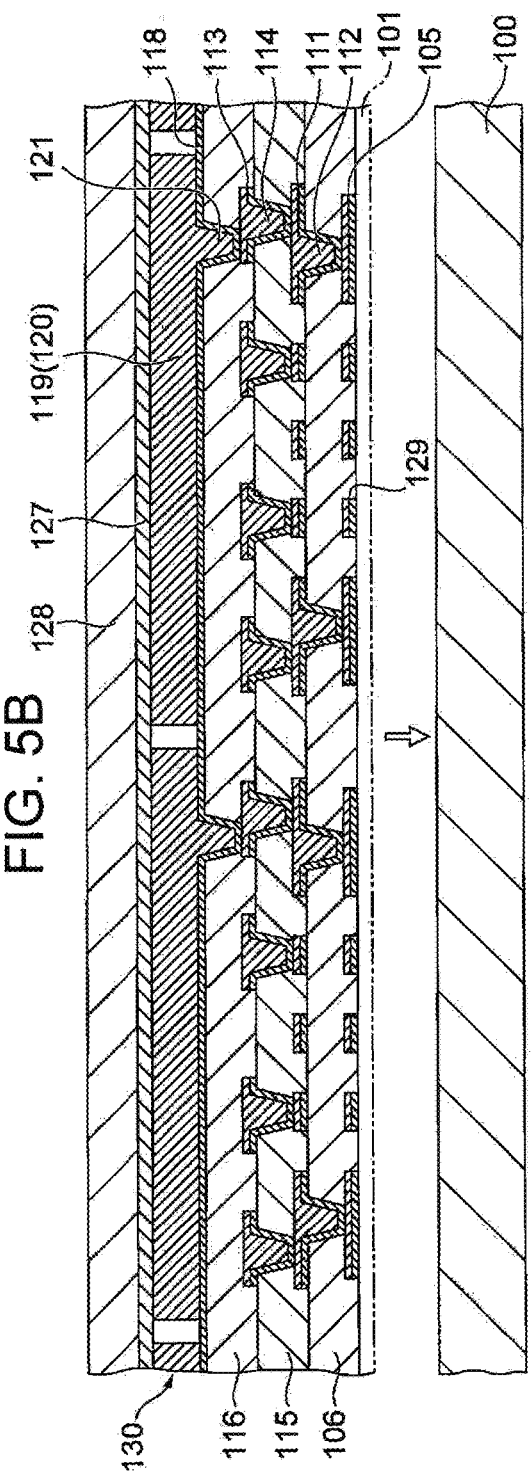

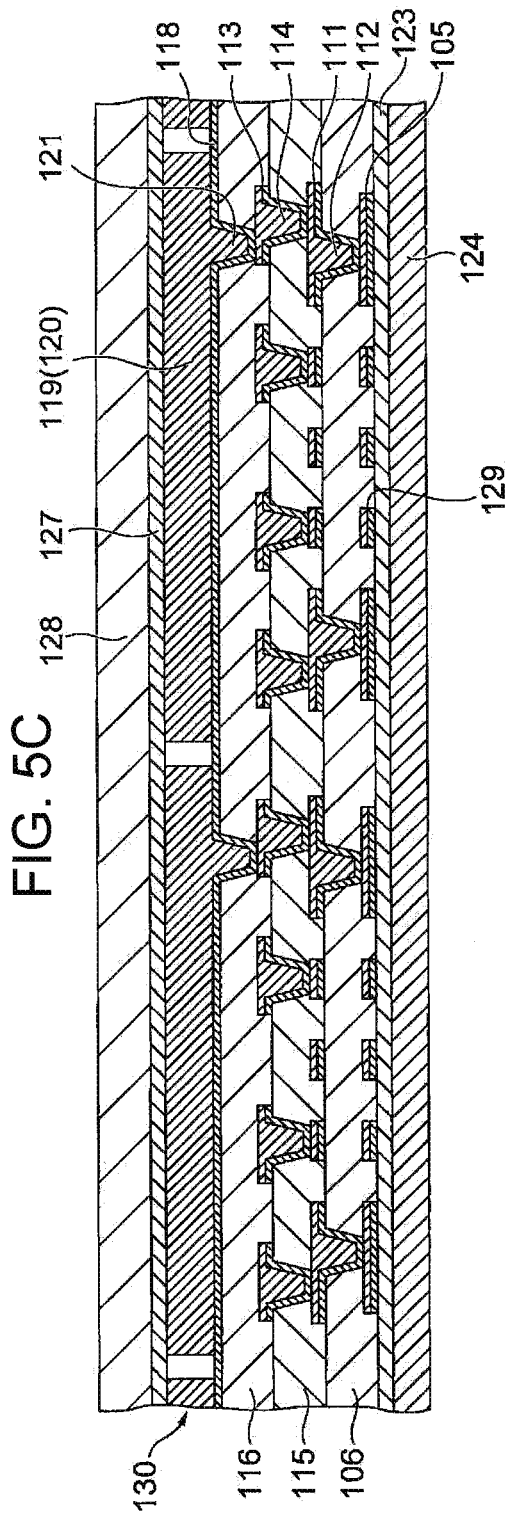
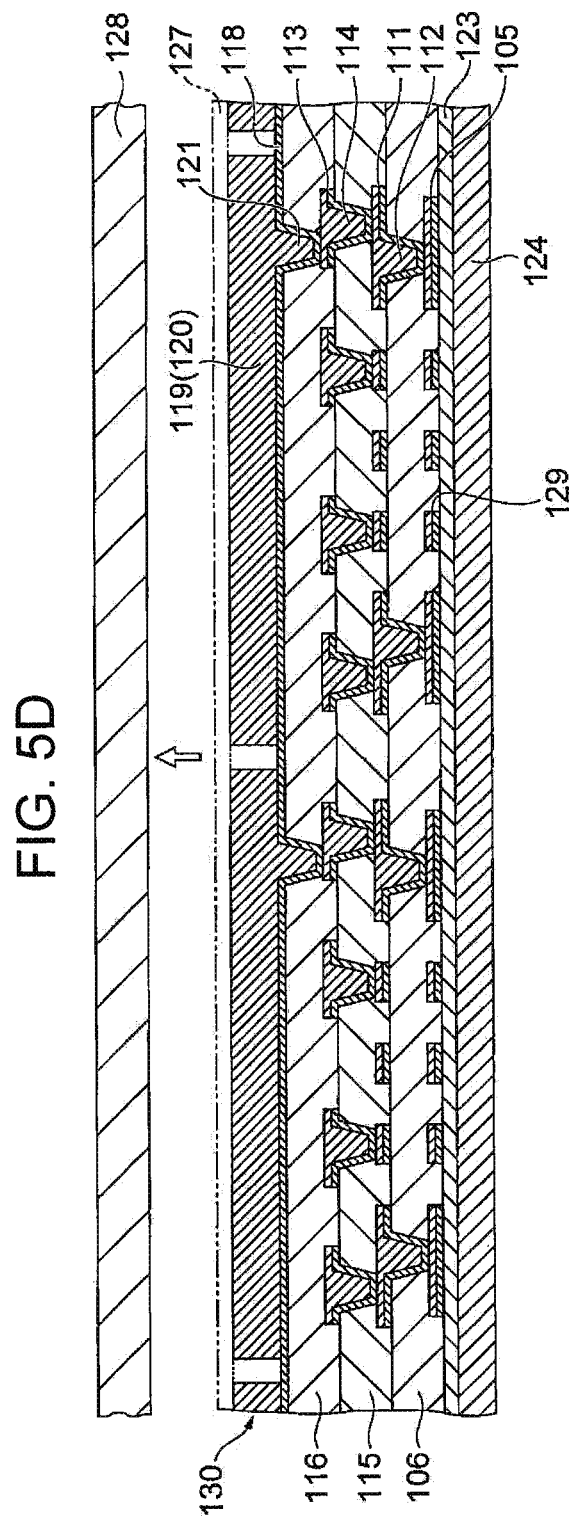
FIG. 5C
FIG. 5D

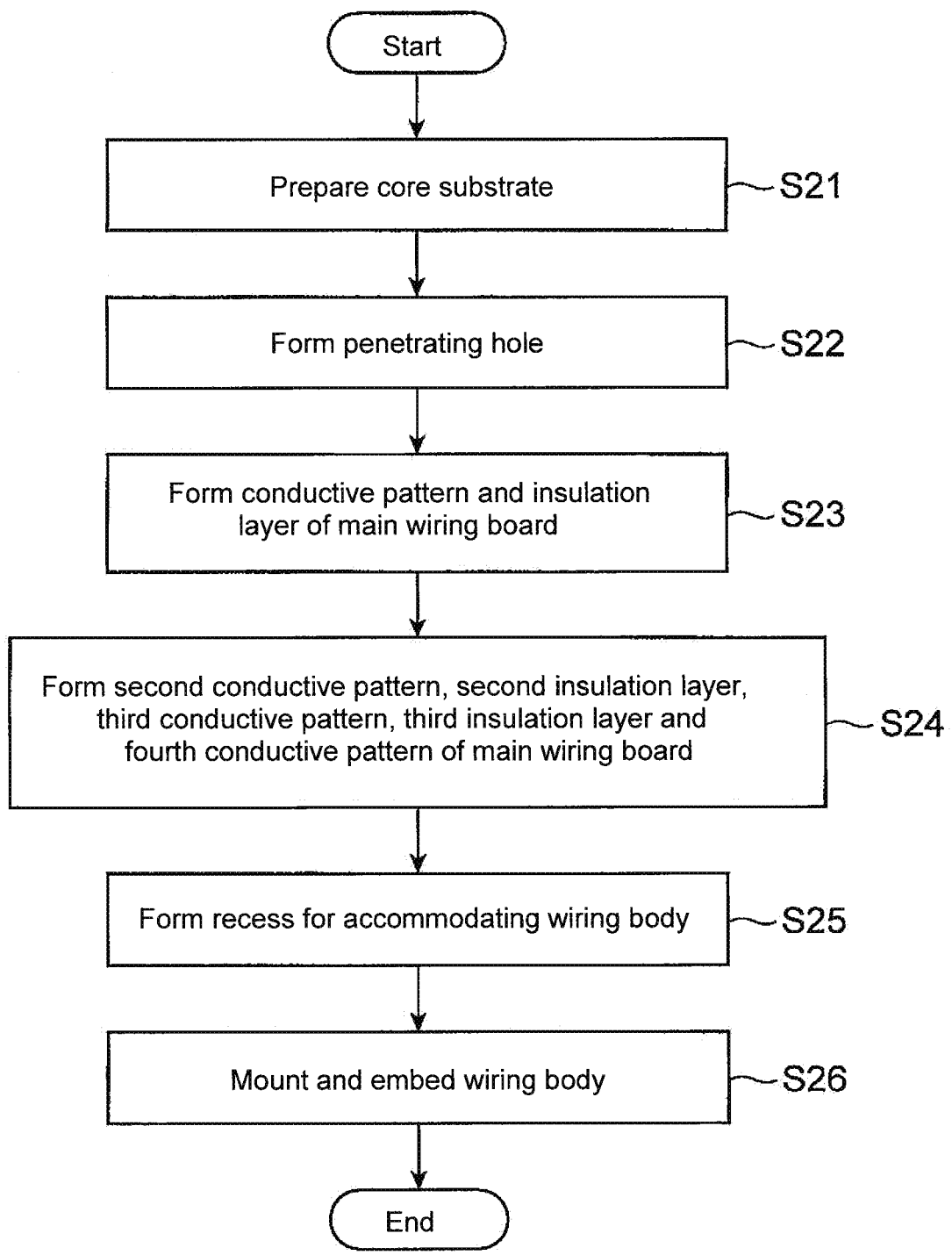

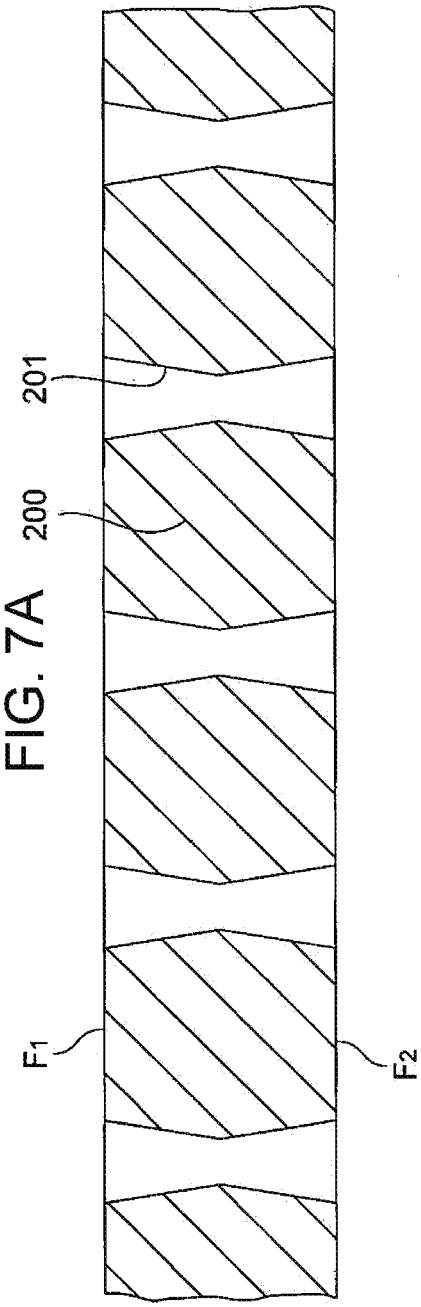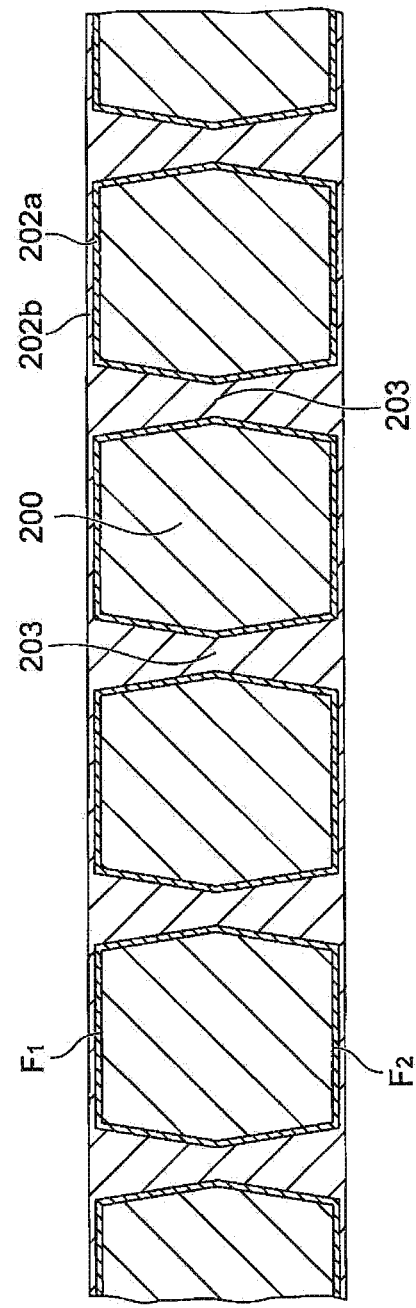

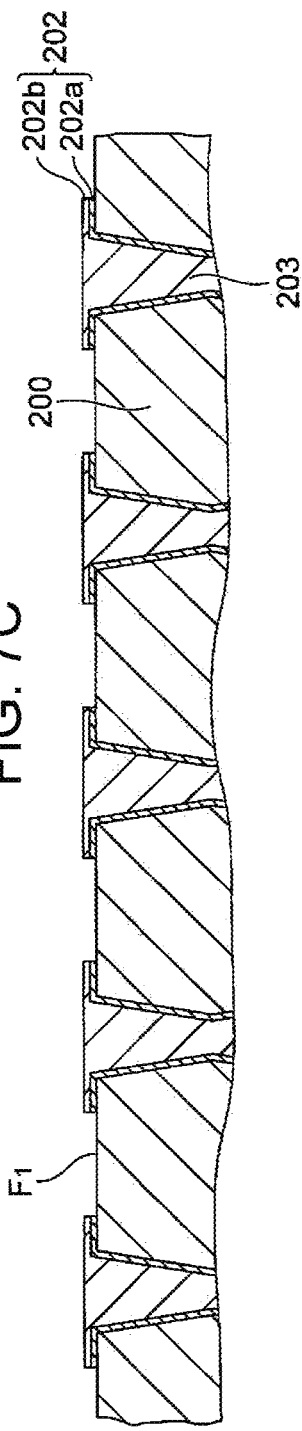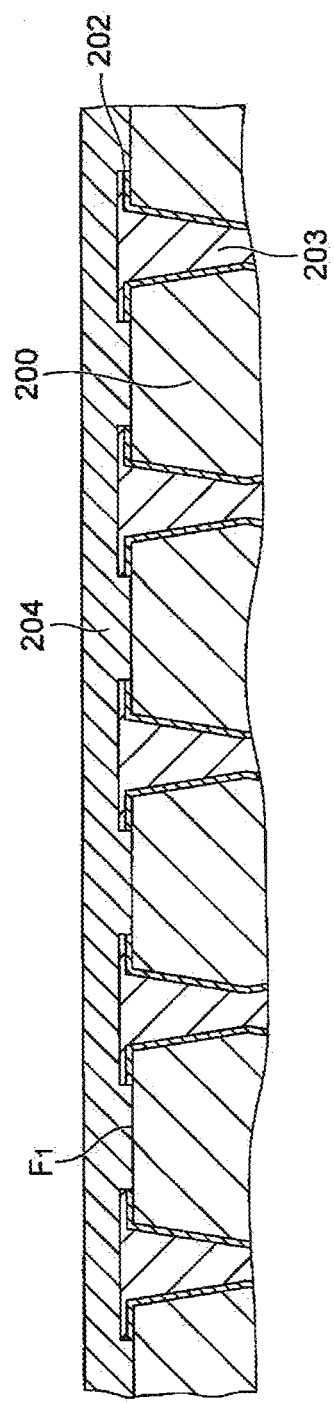

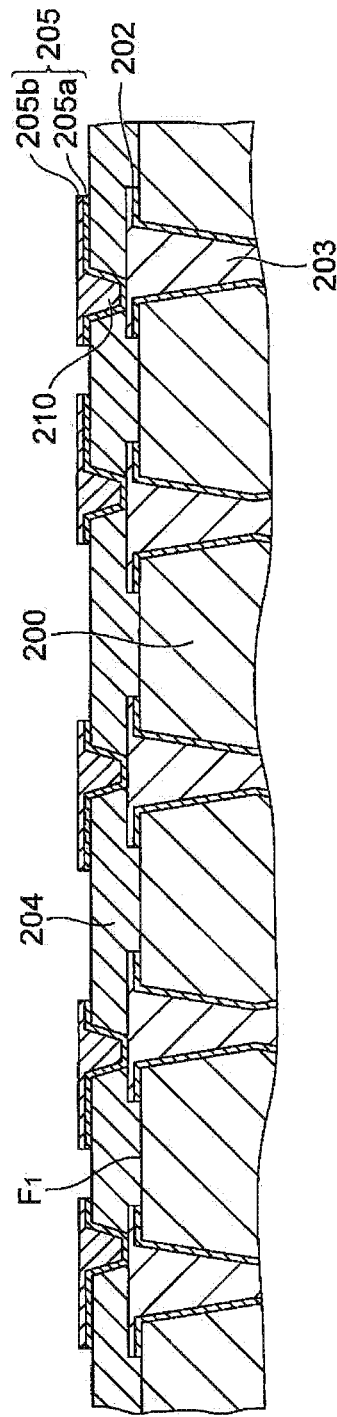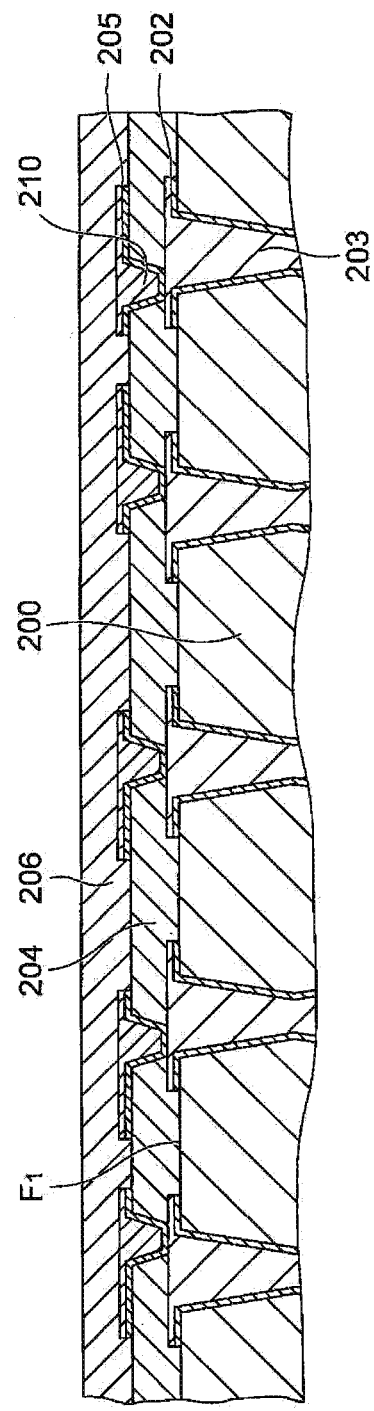

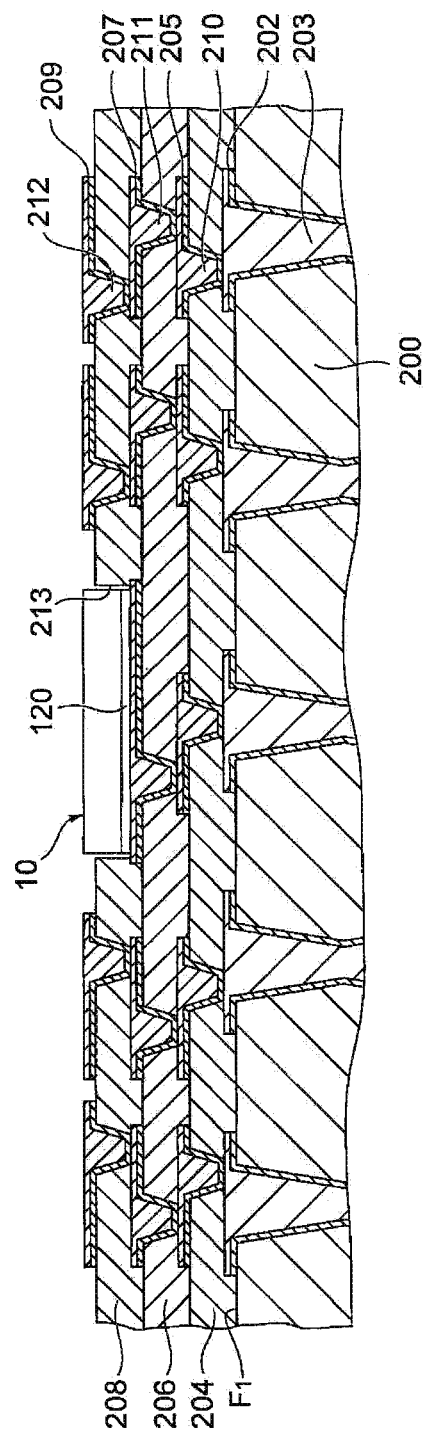
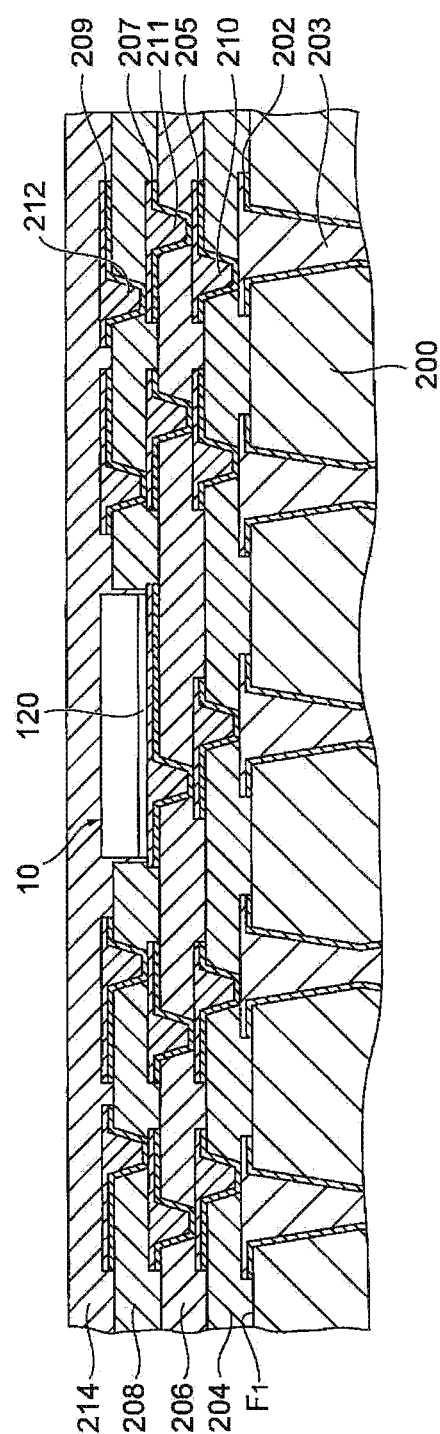

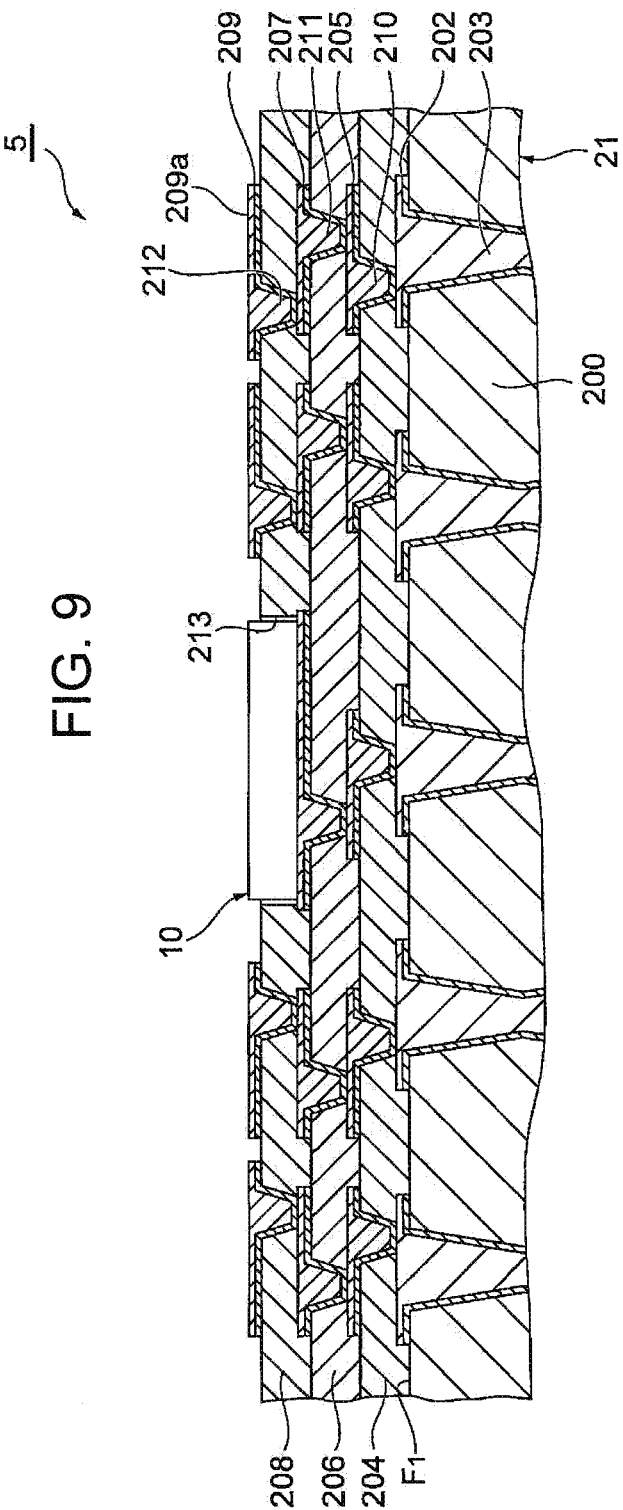

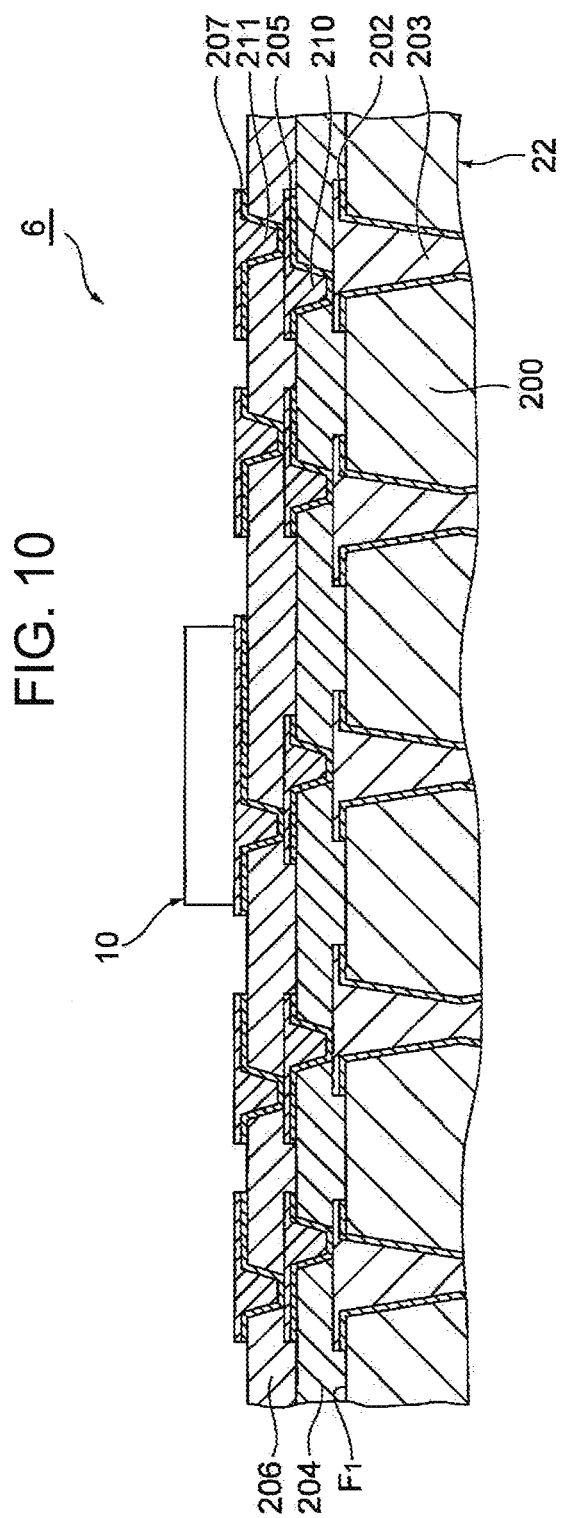

MULTILAYER WIRING BOARD AND METHOD FOR MANUFACTURING SAME

CROSS-REFERENCE TO RELATED APPLICATIONS

The present application is based upon and claims the benefit of priority to Japanese Patent Application No. 2014-151520, filed Jul. 25, 2014, the entire contents of which are incorporated herein by reference.

BACKGROUND OF THE INVENTION

Field of the Invention

The present invention relates to a multilayer wiring board and its manufacturing method.

Description of Background Art

JP2013-214578A describes a multilayer wiring board structured which has a main wiring board formed by alternately laminating conductive patterns and insulation layers and a sub wiring board (wiring structure body) formed separately from the main wiring board. To obtain a multilayer wiring board where mounting pads and conductive patterns are formed at a narrow pitch, the wiring structure body is prepared separately to have narrow-pitch conductive pads and conductive patterns, and then embedded into the main wiring board. The entire contents of this publication are incorporated herein by reference.

SUMMARY OF THE INVENTION

According to one aspect of the present invention, a multilayer wiring board includes a main wiring board which mounts a semiconductor component on a surface of the main wiring board, and a wiring structure body which is mounted to the main wiring board and is formed to be electrically connected to the semiconductor component. The wiring structure body includes conductive pads formed on a first side of the wiring structure body, a heat radiation component formed on a second side of the wiring structure body on the opposite side with respect to the first side, an insulation layer positioned between the conductive pads and the heat radiation component, and via conductors formed in the insulation layer such that each of the via conductors has a diameter which increases from the first side toward the second side of the wiring structure body.

According to another aspect of the present invention, a method for manufacturing a multilayer wiring board includes forming conductive pads on a support plate, forming on the support plate an insulation layer having via conductors such that the insulation layer covers the conductive pads, forming a heat radiation component on the insulation layer such that an array of wiring structure bodies is formed on the support plate, removing the support plate from the array of wiring structure bodies, cutting the array of wiring structure bodies into wiring structure bodies, and mounting one of the wiring structure bodies to a main wiring board such that the heat radiation component faces the main wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4A is a view showing a process in a method for manufacturing a wiring structure body;

FIG. 4B is a view showing a process in the method for manufacturing a wiring structure body;

FIG. 4E is a view showing a process in the method for manufacturing a wiring structure body;

FIG. 4F is a view showing a process in the method for manufacturing a wiring structure body;

FIG. 4G is a view showing a process in the method for manufacturing a wiring structure body;

FIG. 4H is a view showing a process in the method for manufacturing a wiring structure body;

FIG. 4M is a view showing a process in the method for manufacturing a wiring structure body;

FIG. 4N is a view showing a process in the method for manufacturing a wiring structure body;

FIG. 5A is a view showing a modified example of the method for manufacturing a wiring structure body;

FIG. 5B is a view showing the modified example of the method for manufacturing a wiring structure body;

FIG. 5C is a view showing the modified example of the method for manufacturing a wiring structure body;

FIG. 5D is a view showing the modified example of the method for manufacturing a wiring structure body;

FIG. 6 is a flowchart showing a method for manufacturing a main wiring board and for embedding a wiring structure body;

FIG. 7A is a view showing a process in a method for manufacturing a main wiring board;

FIG. 7B is a view showing a process in the method for manufacturing a main wiring board;

FIG. 7C is a view showing a process in the method for manufacturing a main wiring board;

FIG. 7D is a view showing a process in the method for manufacturing a main wiring board;

FIG. 7E is a view showing a process in the method for manufacturing a main wiring board;

FIG. 7F is a view showing a process in the method for manufacturing a main wiring board;

FIG. 8A is a view showing a process in a method for manufacturing a multilayer wiring board by embedding a wiring structure body in a main wiring board;

FIG. 8B is a view showing a process in the method for manufacturing a multilayer wiring board by embedding a wiring structure body in a main wiring board;

FIG. 9 is a cross-sectional view showing part of a multilayer wiring board according to a second embodiment; and FIG. 10 is a cross-sectional view showing part of a multilayer wiring board according to a third embodiment.

DETAILED DESCRIPTION OF THE EMBODIMENTS

Figure 1:
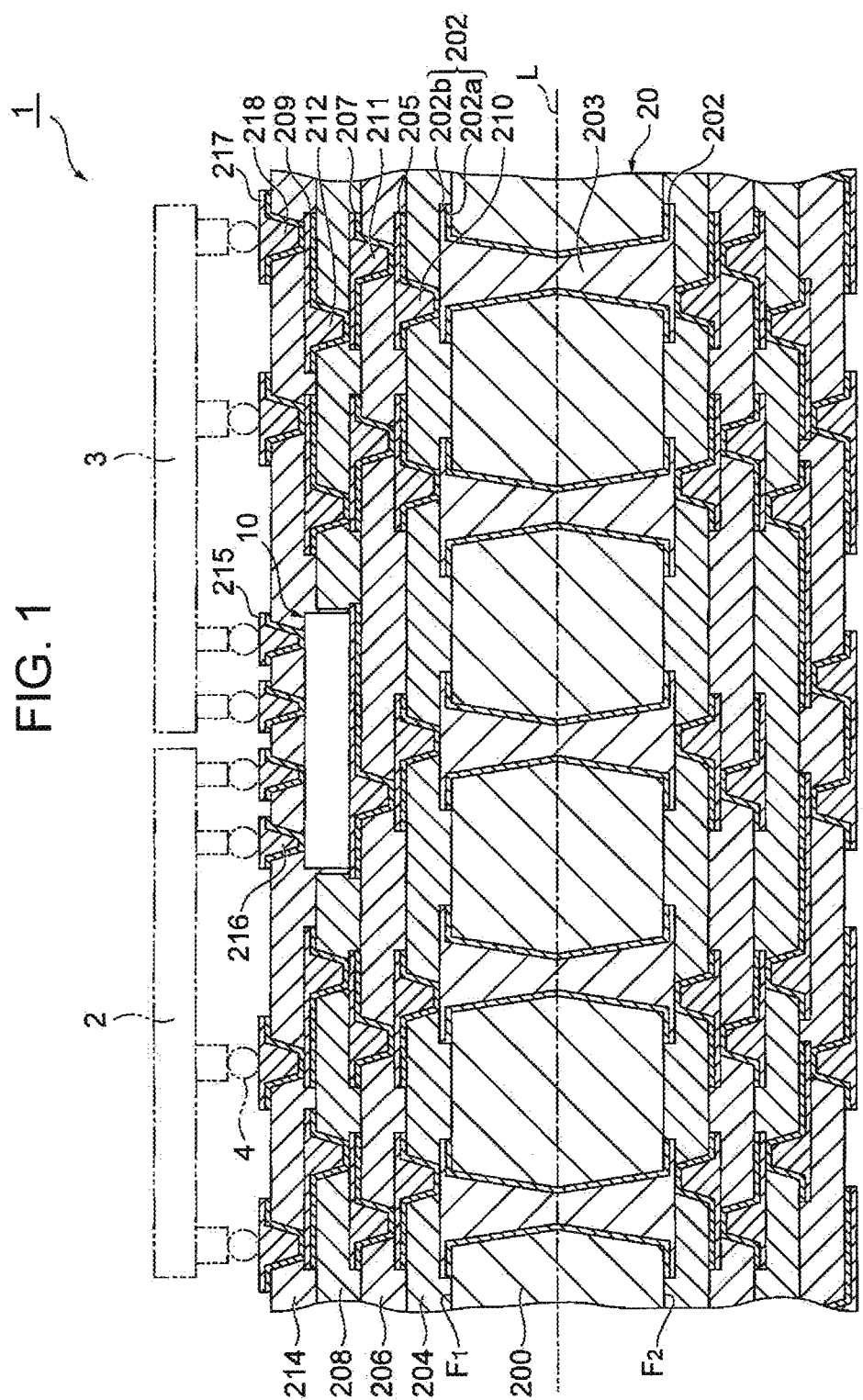
FIG. 1 is a cross-sectional view showing part of a multilayer wiring board according to a first embodiment of the present invention.

The embodiments will now be described with reference to the accompanying drawings, wherein like reference numerals designate corresponding or identical components throughout the various drawings.

First Embodiment

As shown in FIG. 1, multilayer wiring board 1 according to a first embodiment has main wiring board 20 and wiring structure body 10 embedded in main wiring board 20. Main wiring board 20 is a buildup multilayer wiring board formed to have insulation layers and conductive patterns alternately laminated respectively on main surfaces (F1, F2) of core substrate 200 so that core substrate 200 is positioned in the center. Except for the portion to embed wiring structure body 10, main wiring board 20 is formed by laminating a layer of the same function simultaneously on both sides in each process so as to sandwich the center axis (L) of core substrate 200. Therefore, the following descriptions are provided using only one side (main-surface (F1) side) of core substrate 200.

First conductive patterns 202 of the main wiring board are formed on core substrate 200. First conductive patterns 202 are made up of electroless plated layer (202a) and electrolytic plated layer (202b), and are covered by first insulation layer 204 of the main wiring board. First insulation layer 204 is made of thermosetting epoxy resin, for example.

In the main wiring board, second conductive patterns 205, second insulation layer 206 to cover second conductive patterns 205, third conductive patterns 207, third insulation layer 208 to cover third conductive patterns 207, fourth conductive patterns 209, and fourth insulation layer 214 to cover fourth conductive patterns 209 are further laminated on first insulation layer 204 in that order. Second conductive patterns 205, third conductive patterns 207 and fourth conductive patterns 209 are each made up of electroless plated layer and electrolytic plated layer, the same as first conductive patterns 202. On the other hand, second insulation layer 206, third insulation layer 208 and fourth insulation layer 214 are each made of a thermosetting epoxy resin.

Also in the main wiring board, first via conductors 210 are formed in first insulation layer 204, second via conductors 211 are formed in second insulation layer 206, and third via conductors 212 are formed in third insulation layer 208. Those via conductors (210, 211, 212) of the main wiring board are shaped as a truncated cone. First conductive patterns 202 and second conductive patterns 205 are electrically connected by first via conductors 210 positioned in between. Also electrically connected in the main wiring board are: second conductive patterns 205 and third conductive patterns 207 by second via conductors 211 positioned in between; and third conductive patterns 207 and fourth conductive patterns 209 by third via conductors 212 positioned in between. Moreover, first conductive patterns 202 on main surface (F1) of core substrate 200 are electrically connected to first conductive patterns 202 on opposite main surface (F2) by through-hole conductors 203 formed in core substrate 200.

Wiring structure body 10 is embedded in main wiring board 20 on the main-surface (F1) side. Wiring structure body 10 is positioned on third conductive patterns 207 of main wiring board 20 while being parallel to fourth conductive patterns 209 and third via conductors 212 of the main wiring board. Wiring structure body 10 is covered by fourth insulation layer 214 positioned outermost of main wiring board 20 so as to be encapsulated in main wiring board 20. Multiple first mounting pads 215 and second mounting pads 217 are formed on fourth insulation layer 214. Upper surfaces of first mounting pads 215 and second mounting pads 217 are made substantially flush with each other. First mounting pads 215 are positioned directly on wiring structure body 10 and are electrically connected to conductive pads 105 or to third conductive patterns 129 positioned on the upper surface of wiring structure body 10 through via conductors 216 formed in fourth insulation layer 214 of the main wiring board.

Meanwhile, second mounting pads 217 are positioned above fourth conductive patterns 209 and are electrically connected to fourth conductive patterns 209 through fifth via conductors 218 formed in insulation layer 214. As shown in FIG. 1, first mounting pads 215 are formed to have a narrower pitch than second mounting pads 217. When MPU 2 (micro-processing unit: semiconductor component) and DRAM 3 (dynamic random access memory: semiconductor component) are mounted on multilayer wiring board 1, those semiconductor components are electrically connected to first mounting pads 215 and second mounting pads 217 through solder bumps 4.

Figure 2:
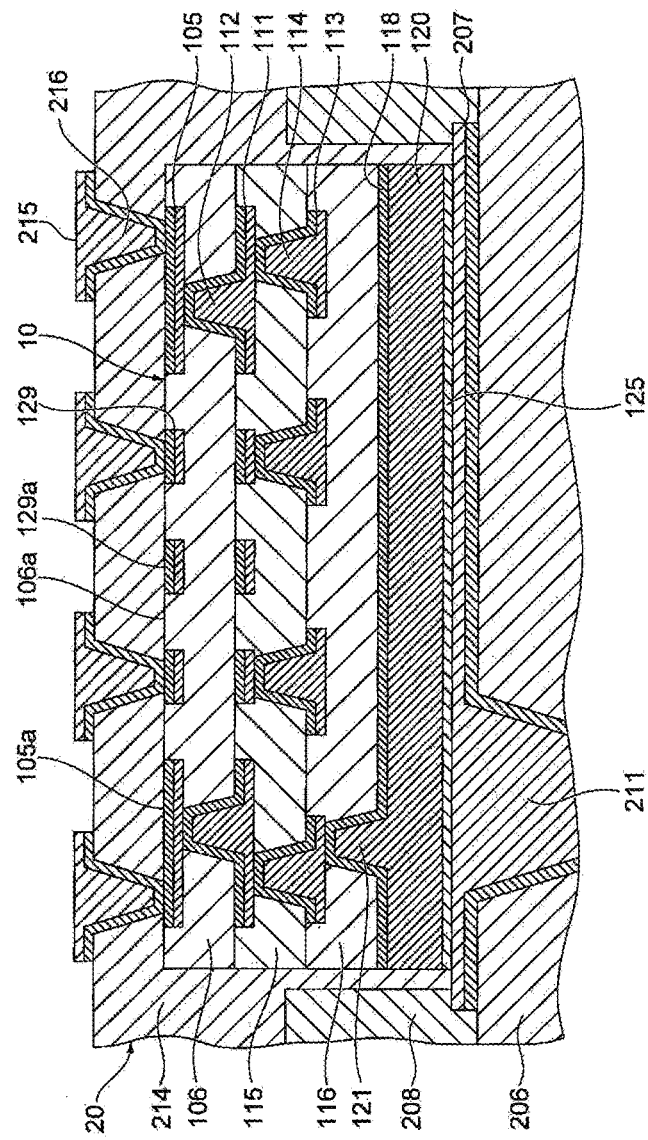
FIG. 2 is an enlarged cross-sectional view of the wiring structure body shown in FIG. 1.

As shown in FIG. 2, wiring structure body 10 has a cross-sectional rectangular shape, and its three-dimensional shape is also rectangular. Wiring structure body 10 has multiple conductive pads 105 on the one side and heat radiation component 120 on the other side. Heat radiation component 120 is positioned below conductive pads 105 (that is, closer to core substrate 200 of main wiring board 20), and is fixed to third conductive pattern 207 of main wiring board 20 through die attach film (adhesive layer) 125. Heat radiation component 120 is a metal-plated layer made of copper plating, for example, and is preferred to be 10~80 μm thick. In the present embodiment, the thickness of heat radiation component 120 is set at 50 μm.

Seed layer 118 is formed on heat radiation component 120. In the wiring structure body, first insulation layer 116, first conductive patterns 113, second insulation layer 115, second conductive patterns 111 and third insulation layer 106 are laminated in that order on seed layer 118. First insulation layer 116, second insulation layer 115 and third insulation layer 106 of the wiring structure body are photosensitive resin layers. When photosensitive resin layers are used, it is easier to form fine-diameter via holes in insulation layers and to make narrow-pitch conductive patterns in the wiring structure body.

First conductive patterns 113 and second conductive patterns 111 of the wiring structure body are made of a seed layer and a copper plated layer. Also in the wiring structure body, first via conductors 121 are formed in first insulation layer 116, second via conductors 114 are formed in second insulation layer 115, and third via conductors 112 are formed in third insulation layer 106.

Conductive pads 105 are positioned opposite heat radiation component 120 and are made of a seed layer and a copper plated layer. Since laser beams are irradiated for forming wiring structure body 10, the thickness of conductive pads 105 is preferred to be 5 μm or greater to suppress any impact from laser irradiation on conductive pads 105.

As shown in FIG. 2, conductive pads 105 are surrounded by third insulation layer 106 of the wiring structure body. Of the multiple conductive pads 105, the space between adjacent conductive pads 105 is filled with third insulation layer 106. Upper surface (106a) of third insulation layer 106 filling the space between adjacent conductive pads 105 is made flush with upper surfaces (105a) of conductive pads 105. By so setting, conductive pads 105 are prevented from peeling because there is no gap between them. In addition, multiple third conductive patterns 129 made of a seed layer and a copper-plated layer are positioned between adjacent conductive pads 105. Upper surfaces (129a) of those third conductive patterns 129 are made flush with upper surfaces (105a) of conductive pads 105.

Conductive pads 105 and second conductive patterns 111 of the wiring structure body are electrically connected by third via conductors 112 positioned in between. Also electrically connected in the wiring structure body are: second conductive patterns 111 and first conductive patterns 113 by second via conductors 114 positioned in between; and first conductive patterns 113 and heat radiation component 120 by first via conductors 121 positioned in between.

In wiring structure body 10, first via conductors 121, second via conductors 114 and third via conductors 112 are each formed in a truncated cone shape and have diameters that increase from conductive pads 105 toward heat radiation component 120. Namely, the diameters of those via conductors in wiring structure body 10 are set to gradually increase downward. On the other hand, among the via conductors (210, 211, 212, 216, 218) of main wiring board 20, at least second via conductors 211 and fourth via conductors 216 connected to wiring structure body 10 have diameters that increase in a direction opposite the direction in which the diameters of via conductors of the wiring structure body are set to increase. Namely, multiple fourth via conductors 216 connected to conductive pads 105 of wiring structure body 10 each have a diameter that decreases gradually downward. In the same manner, second via conductors 211 of the main wiring board connected to heat radiation component 120 of wiring structure body 10 each have a diameter that decreases gradually downward.

Multilayer wiring board 1 structured as above is provided with heat radiation component 120 in wiring structure body 10. Thus, heat is efficiently radiated to the outside through heat radiation component 120, thereby improving the heat radiation performance of multilayer wiring board 1. Accordingly, when semiconductor components (here, MPU 2 and DRAM 3) electrically connected to wiring structure body 10 are in operation, generated heat is transmitted to wiring structure body 10 through first mounting pads 215 and fourth via conductors 216 of the main board, and wiring structure body 10 discharges the heat to the outside through heat radiation component 120. As a result, the semiconductor components are certainly prevented from exposure to high heat, and their steady operations are thereby secured.

In addition, since via conductors (121, 114, 112) in the wiring structure body are set to have diameters increasing from conductive pads 105 toward heat radiation component 120, the areas in contact with heat radiation component 120 are greater than the via conductors that are set to have diameters decreasing from conductive pads 105 toward heat radiation component 120. Accordingly, heat generated during operation of semiconductor components is promptly transmitted to heat radiation component 120. As a result, the heat radiation performance of multilayer wiring board 1 is further enhanced.

Moreover, among via conductors (210, 211, 212, 216, 218) of the main wiring board, at least second via conductors 211 and fourth via conductors 216 connected to wiring structure body 10 have diameters that increase in a direction opposite the direction in which diameters of via conductors (121, 114, 112) of the wiring structure body are set to increase. By positioning via conductors to have diameters increasing in different directions from each other, stress is mitigated when caused due to the difference in thermal expansion coefficients of wiring structure body 10 and main wiring board 20. Accordingly, warping or cracking derived from such stress is prevented.

Following are descriptions of a method for manufacturing multilayer wiring board 1 according to an embodiment of the present invention. An example of the manufacturing method of multilayer wiring board 1 includes a method for manufacturing wiring structure body 10, a method for manufacturing main wiring board 20, and a method for manufacturing multilayer wiring board 1 by embedding wiring structure body 10 into main wiring board 20. First, a method is described for manufacturing wiring structure body 10 by referring to FIG. 3~5.

Method for Manufacturing Wiring Structure Body

A method for manufacturing wiring structure body 10 according to an embodiment (wiring structure body manufacturing processes) is characterized by forming conductive pads, followed by forming insulation layers and conductive patterns, and then by forming a heat radiation component. More specifically, first, in process (S11) shown in FIG. 3, support plate 100 is prepared (see FIG. 4A). Support plate 100 is a glass plate with a flat surface and its thermal expansion coefficient is low. Then, release layer 101 is formed on support plate 100. The thickness of release layer 101 is 4 μm, for example.

Figure 3:
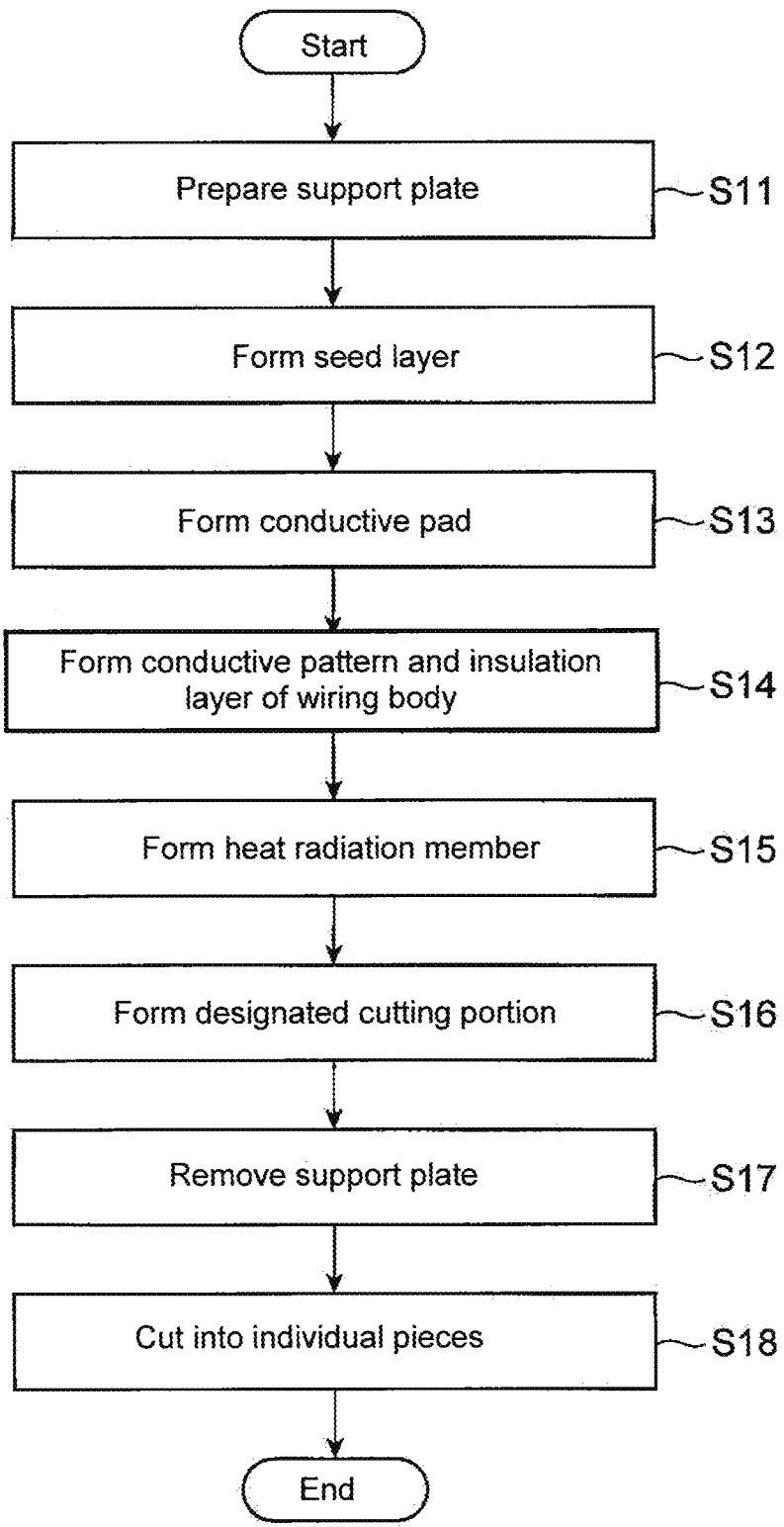
FIG. 3 is a flowchart showing a method for manufacturing a wiring structure body.

In process (S12) of FIG. 3, seed layer 102 is formed on release layer 101 (see FIG. 4B). Seed layer 102 is formed by sputtering, for example, and is made of titanium, copper or the like, for example.

In process (S13) of FIG. 3, conductive pads 105 are formed. Predetermined resist pattern 103 is formed on seed layer 102. More specifically, a photosensitive resist layer is coated on seed layer 102, and exposure-to-light and development treatments are conducted on the resist layer so that predetermined resist pattern 103 is formed (see FIG. 4C).

Next, copper-plated layer 104 is formed on portions of seed layer 102 where no resist pattern 103 is formed. Here, copper-plated layer 104 may be an electroless plated layer, electrolytic plated layer, or a laminated layer of electroless and electrolytic plated layers. Then, predetermined resist pattern 103 is removed from seed layer 102, and etching is performed on portions of seed layer 102 exposed by the removal of resist pattern 103. The seed layer 102 and copper-plated layer 104 remaining on release layer 101 form conductive pads 105 or third conductive patterns 129 to be connected to semiconductor components in predetermined positions (see FIG. 4D).

In the present embodiment, conductive pads 105 made up of seed layer 102 and copper-plated layer 104 are preferred to have a thickness of 5 μm or greater. That is because such a thickness can minimize impact on conductive pads from laser irradiation when release layer 101 is removed by laser beams in a subsequent process.

The above-described method for forming conductive pads 105 is the same as that generally employed for forming wirings of semiconductor components. Thus, narrow-pitch conductive pads 105 are obtained.

In process (S14) of FIG. 3, conductive patterns and insulation layers are formed in the wiring structure body. In particular, third insulation layer 106 is formed to cover conductive pads 105, third conductive patterns 129 and release layer 101. Third insulation layer 106 is formed by coating insulation material made of photosensitive polyimide resin and by applying heat thereon.

Next, using a mask with openings formed at predetermined positions, third insulation layer 106 is exposed to light and developed. Accordingly, via holes 107 are formed at predetermined positions. Next, seed layer 108 is formed by sputtering on third insulation layer 106 and on the inner-wall and bottom surfaces of via holes 107 (see FIG. 4E).

Next, predetermined resist pattern 109 is formed on seed layer 108 by the same method as that for above resist pattern 103 (see FIG. 4F). Then, copper-plated layer 110 is formed on portions of seed layer 108 that are not covered by resist pattern 109. Then, resist pattern 109 is removed, and etching is performed on portions of seed layer 108 exposed by the removal of resist pattern 109. Accordingly, second conductive patterns 111 are formed by seed layer 108 and copper-plated layer 110 remaining on third insulation layer 106. Also, copper is filled in via holes 107 when copper-plated layer 110 is formed. The filled copper forms third via conductors 112 (see FIG. 4G).

Next, by repeating the above processes, second insulation layer 115, first conductive patterns 113, second via conductors 114 and first insulation layer 116 are formed in that order (see FIG. 4H).

In process (S15) of FIG. 3, heat radiation component 120 is formed in wiring structure body 10. More specifically, using a mask with openings at predetermined positions of insulation layer 116, exposure-to-light and development treatments are conducted on first insulation layer 116 so that via holes 117 are formed in predetermined portions. Next, seed layer 118 is formed by sputtering on first insulation layer 116 and on the inner-wall and bottom surfaces of via holes 117 (see FIG. 4I).

Next, copper-plated layer 119 is formed on seed layer 118. It is preferred for copper-plated layer 119 to have a thickness of 50 μm. Copper-plated layer 119 on seed layer 118 forms heat radiation component 120. Also, copper is filled in via holes 117 when copper-plated layer 119 is formed. The filled copper makes first via conductors 121 (see FIG. 4J). Accordingly, wiring-body array 130 having multiple wiring structure bodies 10 is formed on support plate 100.

In process (S16) of FIG. 3, portions are designated for cutting wiring-body array 130. In particular, resist layer 122 is formed by coating photosensitive resist on copper-plated layer 119. Then, exposure-to-light and development treatments are conducted on resist layer 122 so that resist openings (122a) are formed in portions designated for cutting wiring-body array 130.

Figure 4C:
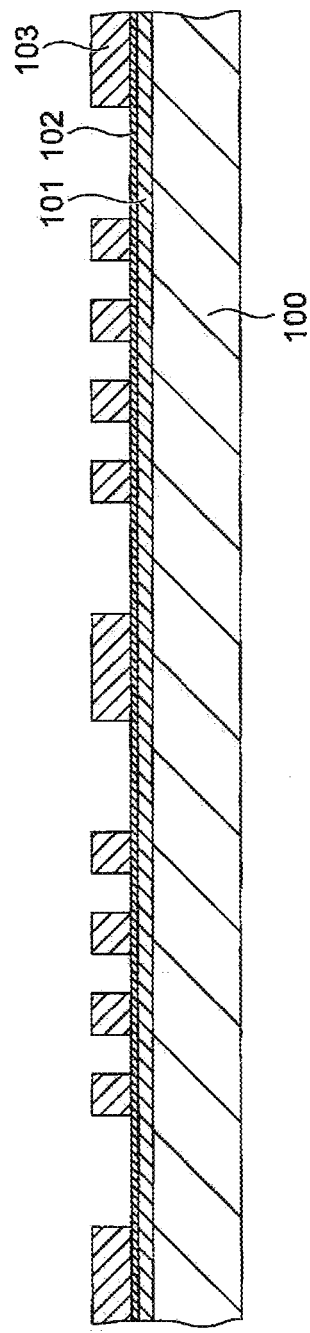
FIG. 4C is a view showing a process in the method for manufacturing a wiring structure body.
Figure 4D:
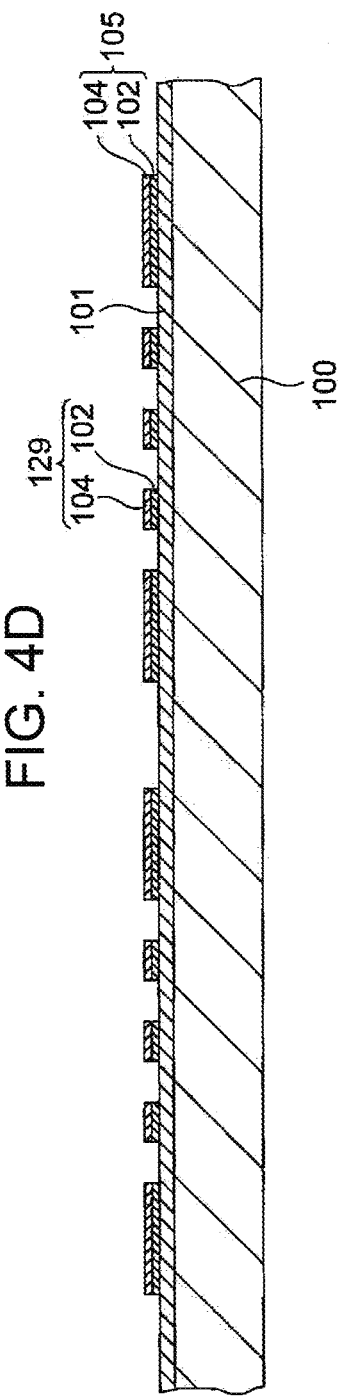
FIG. 4D is a view showing a process in the method for manufacturing a wiring structure body.
Figure 4I:
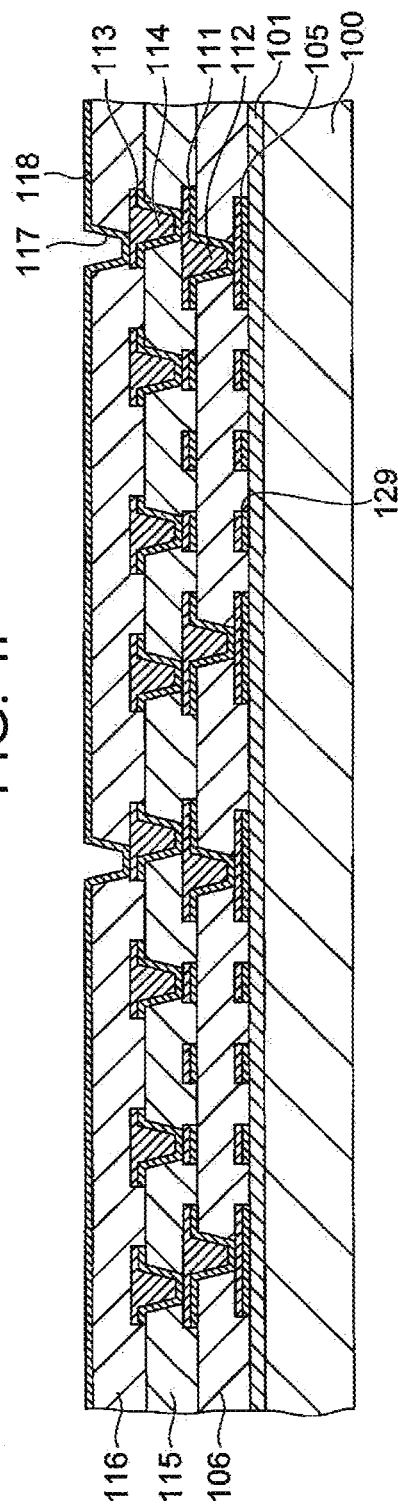
FIG. 4I is a view showing a process in the method for manufacturing a wiring structure body.
Figure 4J:
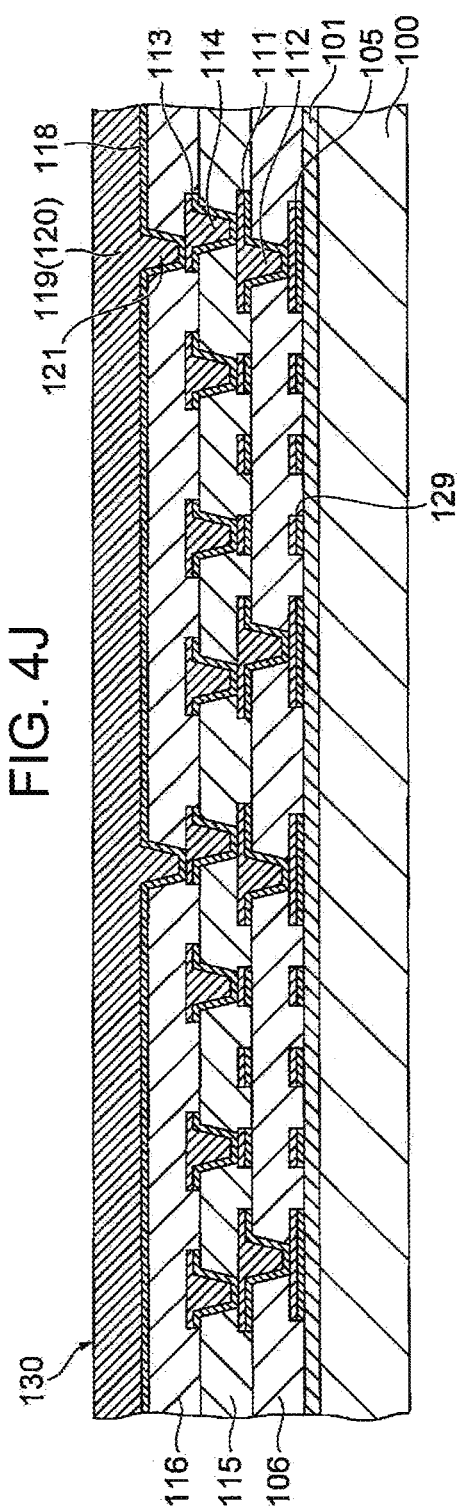
FIG. 4J is a view showing a process in the method for manufacturing a wiring structure body.
Figure 4K:
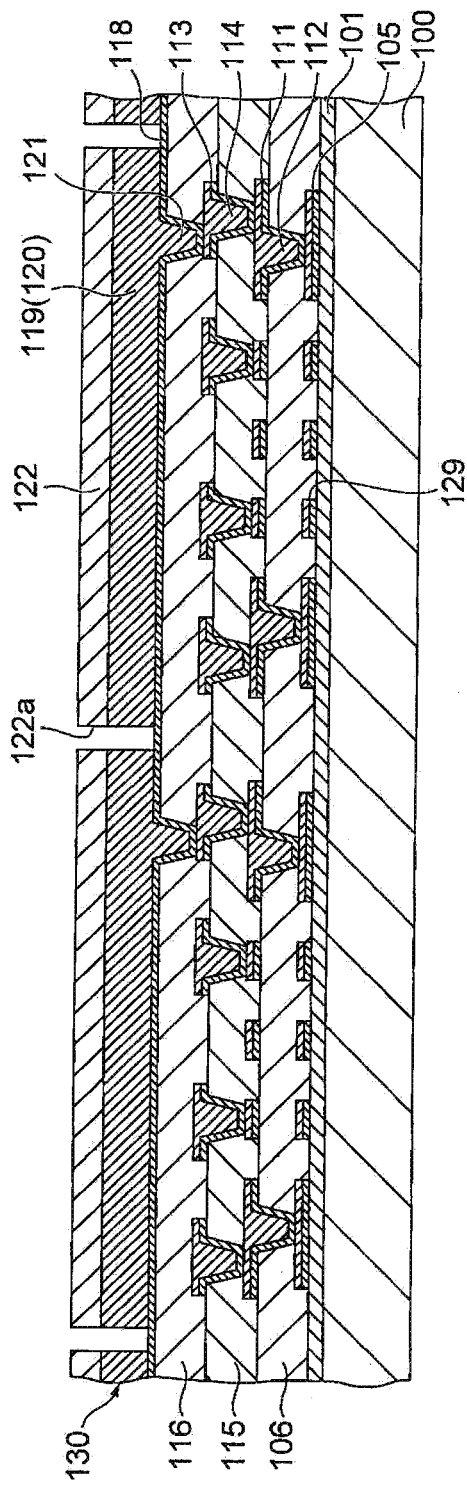
FIG. 4K is a view showing a process in the method for manufacturing a wiring structure body.
Figure 4L:
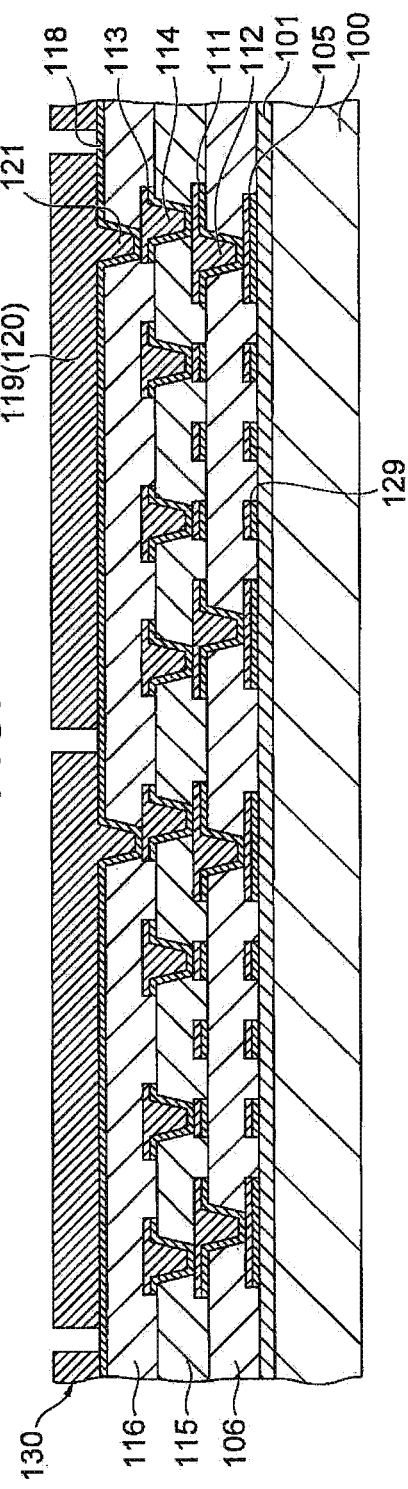
FIG. 4L is a view showing a process in the method for manufacturing a wiring structure body.

Next, etching is performed on portions of copper-plated layer 119 exposed in resist openings (122a) to remove the exposed portions of copper-plated layer 119 (see FIG. 4K). Then, resist layer 122 remaining on copper-plated layer 119 is totally removed. Accordingly, multiple grooves for cutting are formed on designated portions of wiring-body array 130 (FIG. 4L).

In process (S17) of FIG. 3, support plate 100 is removed. More specifically, laser beams are irradiated on release layer 101 from the support plate 100 side so that release layer 101 is softened. Accordingly, support plate 100 is separated from wiring-body array 130 (see FIG. 4M). Since support plate 100 is made of glass in the present embodiment, laser beams are irradiated on release layer 101 through support plate 100. Then, release layer 101 is totally removed, exposing the side where conductive pads 105 are formed. Here, support plate 100 can be cleaned and used again.

In process (S18) of FIG. 3, wiring-body array 130 is cut to obtain individual wiring structure bodies 10. In particular, onto the conductive pads 105 side, reinforcing plate 124 is laminated with thermal release film 123 disposed in between (see FIG. 4N). Reinforcing plate 124 is made of resin material, for example. Next, die attach film 125 is laminated on heat radiation component 120. Then, wafer mounting tape 126 is laminated on the lower side of reinforcing material 124 (see FIG. 4P).

Next, from the heat radiation component 120 side, wiring-body array 130 is cut along the designated portions formed in process (S16). Accordingly, multiple wiring structure bodies 10 arranged on wafer mounting tape 126 are obtained (see FIG. 4Q).

Modified Example of Method for Manufacturing Wiring Structure Body

In the following, a modified example of a method for manufacturing wiring structure body 10 is described by referring to FIG. 5A~5D. The modified example is different in processes (S17) and (S18) from those of the above method, but the rest is the same.

In particular, wiring-body array 130 having designated cutting portions is formed by following the aforementioned processes (S11)~(S16) (see FIG. 4A~4L). In process (S17) for separating support plate 100, reinforcing plate 128 is laminated on heat radiation component 120 with thermal release film 127 disposed in between (see FIG. 5A). Reinforcing plate 128 is made of resin material the same as reinforcing plate 124. Next, laser beams are irradiated on release layer 101 from the support plate 100 side to soften release layer 101 so that support plate 100 is removed from wiring-body array 130 (see FIG. 5B). Then, release layer 101 is totally removed.

Figure 4P:
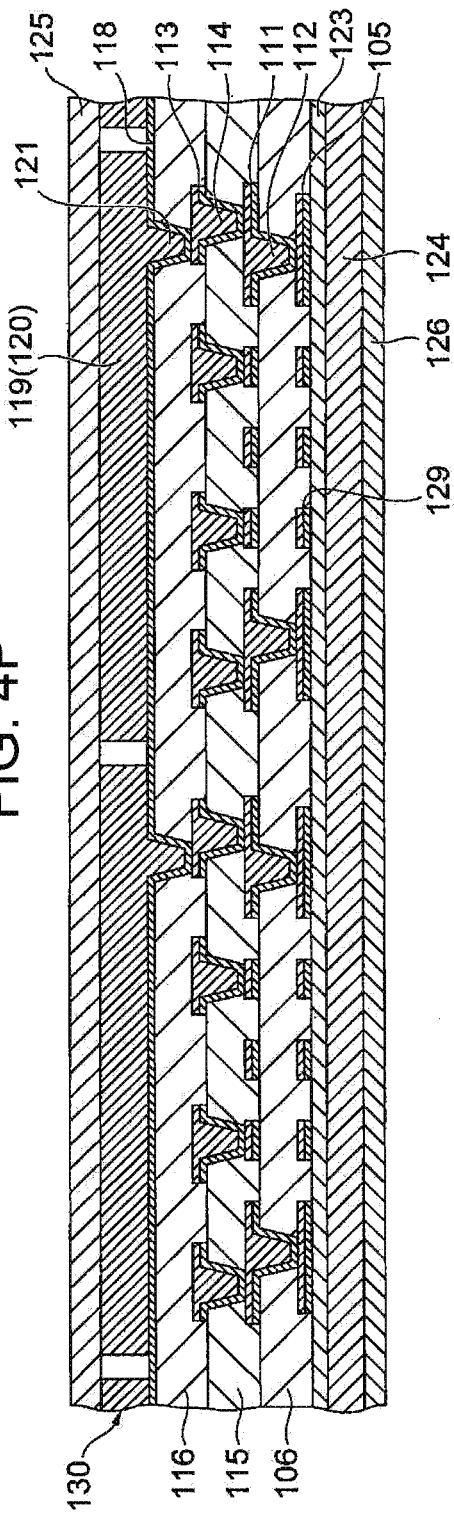
FIG. 4P is a view showing a process in the method for manufacturing a wiring structure body.
Figure 4Q:
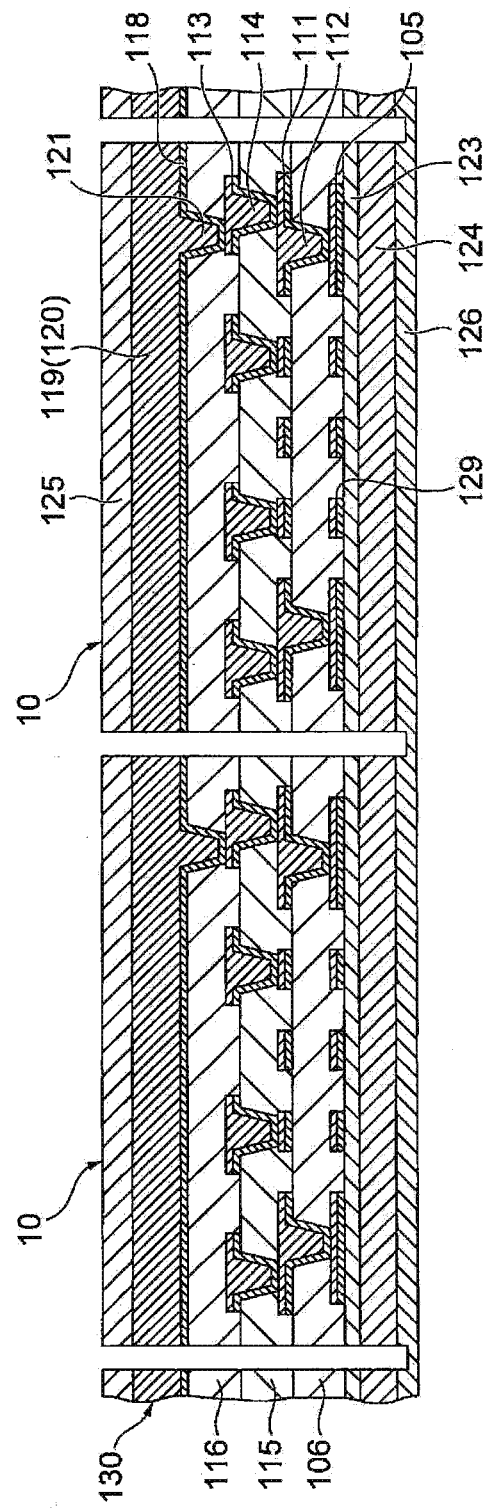
FIG. 4Q is a view showing a process in the method for manufacturing a wiring structure body.

In process (S18) for individually obtaining wiring structure bodies 10, reinforcing plate 124 is laminated on the conductive pads 105 side with thermal release film 123 disposed in between (FIG. 5C). Next, heat is applied on thermal release film 127 so that wiring-body array 130 is separated from thermal release film 127 and reinforcing plate 128 laminated on the heat radiation component 120 side (see FIG. 5D). Accordingly, wiring-body array 130 is obtained, the same as that shown in FIG. 4N. Next, as shown in FIG. 4P, die attach film 125 is laminated on heat radiation component 120, and wafer mounting tape 126 is laminated on the lower side of reinforcing plate 124. Then, from the heat radiation component 120 side, wiring-body array 130 is cut along the designated cutting portions formed in process (S16). Accordingly, multiple wiring structure bodies 10 are obtained as shown in FIG. 4Q.

In the modified example of a method for manufacturing wiring structure body 10, reinforcing plates (124, 128) are employed respectively on the conductive pads 105 side and on the heat radiation component 120 side. Therefore, wiring structure body 10 is further suppressed from warping.

Method for Manufacturing Main Wiring Board

By referring to FIG. 6~8C below, descriptions are provided for a method for manufacturing main wiring board 20 and a method for manufacturing multilayer wiring board 1 by embedding wiring structure body 10 into main wiring board 20. Except for the portion to embed wiring structure body 10, main wiring boards 20 are formed by laminating a layer of the same function simultaneously on both sides in each process so to sandwich center axis (L) of core substrate 200. Therefore, in the process seen in FIG. 7C and the subsequent processes, only one side (the main-surface (F1) side) of core substrate 200 is used.

First, in process (S21) shown in FIG. 6, core substrate 200 is prepared. Core substrate 200 is formed by impregnating epoxy resin into a core made of glass-fiber cloth, for example. Next, copper foil is formed on each of main surfaces (F1, F2) of core substrate 200 (not shown).

In process (S22) of FIG. 6, penetrating holes 201 are formed. More specifically, using a $CO_2$ laser, laser beams are alternately irradiated from both the main surface (F1) side and (F2) side so that penetrating holes 201 are formed in core substrate 200 (see FIG. 7A). After penetrating holes 201 are formed, it is preferred to conduct desmearing by immersing core substrate 200 in a solution containing permanganic acid at a predetermined concentration. Unwanted conduction (short circuiting) is suppressed by conducting a desmearing treatment.

In process (S23) of FIG. 6, first conductive patterns 202 and first insulation layer 204 are formed. More specifically, core substrate 200 is immersed in an electroless plating solution so as to form electroless plated film (202a) on main surfaces (F1, F2) of core substrate 200 with copper foil formed thereon and on the inner-wall surfaces of penetrating holes 201. Copper, nickel or the like is used for forming electroless plated film (202a). Next, electrolytic plated layer (202b) is formed using electroless plated film (202a) as the seed layer. Penetrating holes 201 are filled with electrolytic plating so as to form through-hole conductors 203 (see FIG. 7B).

Next, etching resist with a predetermined pattern is formed on electrolytic plated layer (202b), and then electroless plated layer (202a), electrolytic plated layer (202b) and copper foil are removed from the portions not covered by the etching resist. Then, the etching resist is removed. Accordingly, first conductive patterns 202 are formed with copper foil, electroless plated layer (202a) and electrolytic plated layer (202b) that remain on core substrate 200 (see FIG. 7C). Here, first conductive patterns 202 on main surface (F1) and first conductive patterns 202 on main surface (F2) are electrically connected by through-hole conductors 203.

Next, insulation material is coated on main surface (F1) of core substrate 200 to form first insulation layer 204 (see FIG. 7D). Accordingly, first conductive patterns 202 are covered by first insulation layer 204. Thermosetting epoxy resin, for example, is used as the insulative material.

In process (S24) of FIG. 6, second conductive patterns 205, second insulation layer 206, third conductive patterns 207, third insulation layer 208 and fourth conductive patterns 209 are formed in that order. More specifically, using a $CO_2$ laser, via holes are formed in predetermined portions of first insulation layer 204. Then, electroless plated layer (205a) is formed on the surface of first insulation layer 204 and on the inner-wall and bottom surfaces of via holes. Plating resist with a predetermined pattern is formed on electroless plated layer (205a).

Next, electrolytic plated layer (205b) is formed on portions of electroless plated layer (205a) not covered by the plating resist (namely, exposed portions). Accordingly, via holes are filled with electrolytic plating, and first via conductors 210 are formed by the filled electrolytic plating. Then, the plating resist is removed by a solution containing monoethanolamine. Moreover, portions of electroless plated layer (205a) exposed by the removal of the plating resist are etched away. Accordingly, second conductive patterns 205 are formed by electroless plated layer (205a) and electrolytic plated layer (205b) remaining on first insulation layer 204 (see FIG. 7E).

Figure 7G:
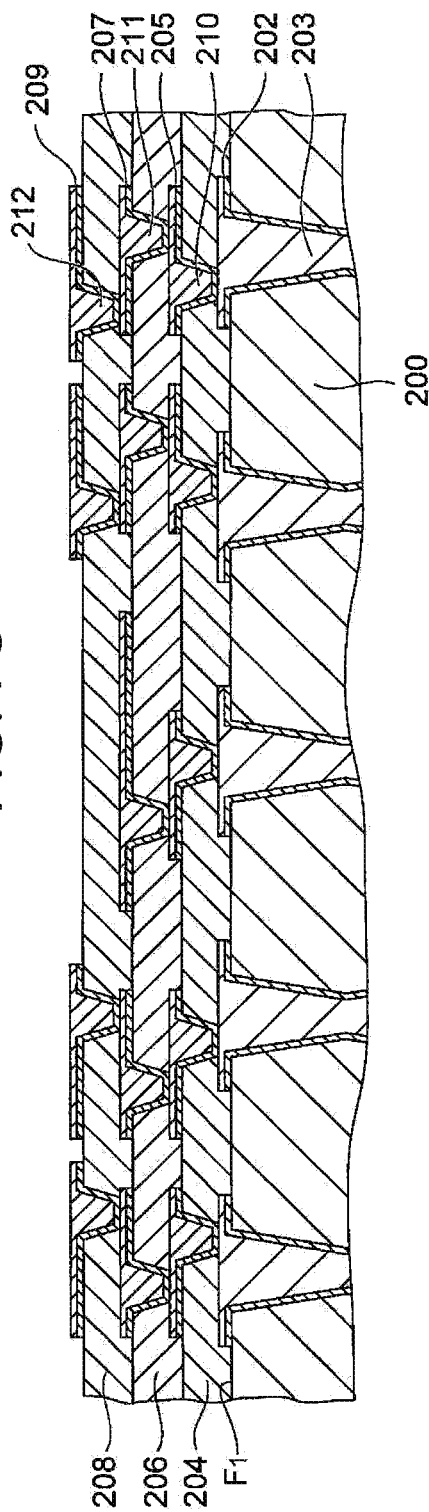
FIG. 7G is a view showing a process in the method for manufacturing a main wiring board.
Figure 7H:
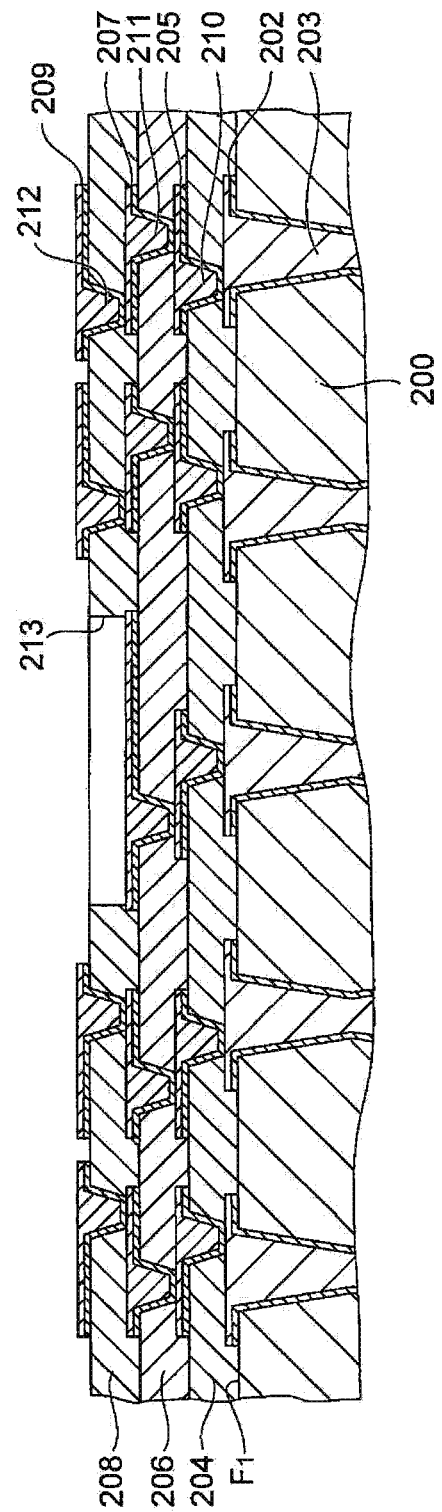
FIG. 7H is a view showing a process in the method for manufacturing a main wiring board.

Next, insulation material is coated on second conductive patterns 205 and first insulation layer 204 so that second insulation layer 206 is formed (see FIG. 7F). By repeating the aforementioned processes, second via conductors 211, third conductive patterns 207, third insulation layer 208, third via conductors 212 and fourth conductive patterns 209 are formed in that order (see FIG. 7G).

Method for Manufacturing Multilayer Wiring Board by Embedding Wiring Structure Body into Main Wiring Board In process (S25) of FIG. 6, recess 213 for accommodating wiring structure body 10 is formed. More specifically, by drilling or laser irradiation, recess 213 is formed in a predetermined position of third insulation layer 203 of the main wiring board (see FIG. 7H). Forming recess 213 exposes third conductive patterns 207 of the main wiring board, which are to be electrically connected to wiring structure body 10 when wiring structure body 10 is accommodated in the recess. Here, recess 213 is formed only on the main surface (F1) side of core substrate 200.

In process (S26) of FIG. 6, wiring structure body 10 as prepared above is mounted and embedded. More specifically, the adhesive intensity of wafer mounting tape 126 is lowered by irradiating ultraviolet rays, and a wiring structure body 10 is picked up from wafer mounting tape 126. Next, wiring structure body 10 is mounted on the bottom surface of recess 213 in a way for heat radiation component 120 of wiring structure body 10 to face downward (process for mounting a wiring structure body) (see FIG. 8A).

Next, heat is applied on thermal release film 123 so that thermal release film 123 and reinforcing plate 124 are separated from wiring structure body 10. Then, by thermally curing die attach film 125 laminated on the lower surface of heat radiation component 120, wiring structure body 10 is bonded to main wiring board 20. In the present embodiment, conductive die attach film 125 is used so that heat radiation component 120 of wiring structure body 10 is electrically connected to third conductive patterns 207 of main wiring board 20. However, it is also an option to use non-conductive die attach film.

Figure 8C:
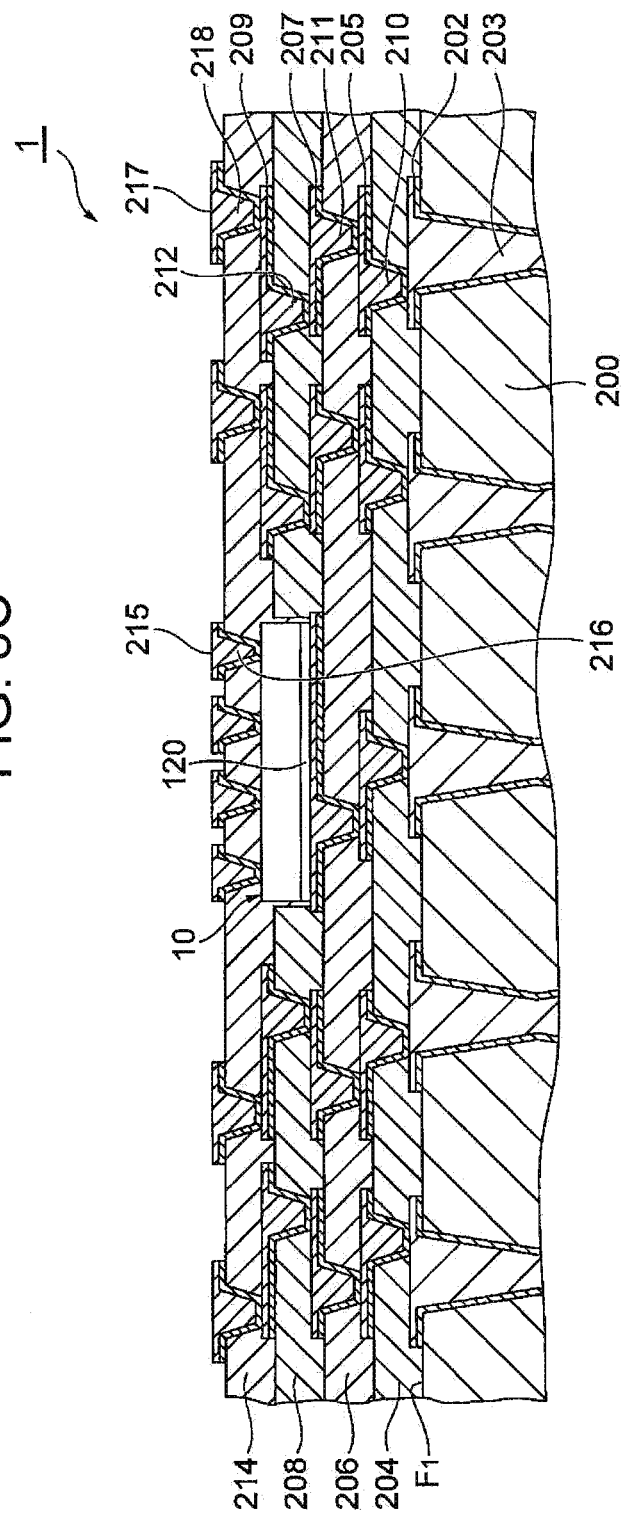
FIG. 8C is a view showing a process in the method for manufacturing a multilayer wiring board by embedding a wiring structure body in a main wiring board.

Next, insulation material is coated on wiring structure body 10, and on fourth conductive patterns 209 and third insulation layer 208 of main wiring board 20 so that fourth insulation layer 214 of the main wiring board is formed (see FIG. 8B). Accordingly, wiring structure body 10 is embedded in main wiring board 20. Then, by repeating the aforementioned processes, first mounting pads 215, as well as fourth via conductors 216 of the main wiring board electrically connecting first mounting pads 215 and conductive pads 105 or third conductive patterns 129, are formed above wiring structure body 10; and second mounting pads 217, as well as fifth via conductors 218 electrically connecting second mounting pads 217 and fourth conductive patterns 209, are formed above fourth conductive patterns 209 of the main wiring board (see FIG. 8C). Then, on each of both surfaces of multilayer wiring board 1, a solder-resist layer is formed with openings to expose first mounting pads 215 and second mounting pads 217 (not shown). Accordingly, multilayer wiring board 1 is completed.

Multilayer wiring board 1 manufactured above has heat radiation component 120 positioned in wiring structure body 10. Thus, heat is radiated efficiently through heat radiation component 120, enhancing the heat radiation performance of multilayer wiring board 1. In addition, when wiring structure body 10 is manufactured, conductive pads 105 are covered first by insulation layer 106 of the wiring structure body. Accordingly, even when gaps between adjacent conductive pads 105 are narrow, conductive pads 105 are securely embedded, and peeling of conductive pads 105 is prevented.

Moreover, since heat radiation component 120 is formed in the final process, a flat heat radiation component 120 is achieved compared with manufacturing procedures that form a heat radiation component 120 in an earlier process. As a result, impact on wiring structure body 10 caused by warping of heat radiation component 120 is securely prevented. In addition, since wiring structure body 10 is formed separately from main wiring board 20, even with narrow-pitch wiring set at an L/S of 1 μm/1 μm, such wiring is formed at a high yield.

Second Embodiment

A second embodiment of the present invention is described below by referring to FIG. 9. Multilayer wiring board 5 according to the present embodiment is characterized by wiring structure body 10 exposed without being embedded in main wiring board 21.

More specifically, wiring structure body 10 is positioned in recess 213 formed in third insulation layer 208 of main wiring board 21, and is fixed to third conductive patterns 207 through die attach film 125 (not shown). Unlike wiring structure body 10 of the first embodiment, wiring structure body 10 of the present embodiment is not covered by fourth insulation layer 214, and is exposed along with fourth conductive patterns 209 of main wiring board 21. At that time, upper surfaces (105a) (see FIG. 2) of conductive pads 105 of wiring structure body 10 are made substantially flush with upper surfaces (209a) of fourth conductive patterns 209 of main wiring board 21 in the present embodiment. When semiconductor components (for example, MPU and DRAM) are mounted through solder bumps on multilayer wiring board 5 as structured above, the semiconductor components are electrically connected directly to conductive pads 105 or third conductive patterns 129 of wiring structure body 10 and to fourth conductive patterns 209 of main wiring board 21.

In addition to the same effects as those in the first embodiment, multilayer wiring board 5 of the present embodiment exhibits further enhanced heat radiation performance since wiring structure body 10 is not embedded in main wiring board 21 but exposed so that heat is directly discharged to the outside.

Third Embodiment

A third embodiment of the present invention is described below by referring to FIG. 10. Multilayer wiring board 6 according to the present embodiment is characterized by wiring structure body 10 protruding from main wiring board 22 without being embedded in main wiring board 22.

More specifically, wiring structure body 10 is fixed to third conductive patterns 207 of main wiring board 22 through die attach film 125 disposed in between (not shown). Wiring structure body 10 is exposed to the outside along with third conductive patterns 207 of the main wiring board positioned around wiring structure body 10 while protruding from third conductive patterns 207. When semiconductor components (for example, MPU and DRAM) are mounted through solder bumps on multilayer wiring board 6 as structured above, the semiconductor components are electrically connected directly to conductive pads 105 or third conductive patterns 129 of wiring structure body 10 and to third conductive patterns 207 of main wiring board 22. Regarding the height difference with third conductive patterns 207 caused when wiring structure body 10 is set to protrude, impact from such a height difference is minimized by adjusting the height of solder bumps, for example.

In addition to the same effects as those in the first embodiment, multilayer wiring board 6 of the present embodiment exhibits further enhanced heat radiation performance since wiring structure body 10 is not embedded in main wiring board 22 but protrudes to the outside so that heat is directly discharged to the outside.

Embodiments of the present invention have been described in detail so far. However, the present invention is not limited to those embodiments, and various design modifications are possible within a scope that does not deviate from the gist of the present invention described in patent Claims. For example, an example of wiring structure body 10 described above is provided with three insulation layers and two conductive patterns laminated between conductive pads 105 and heat radiation component 120. However, the numbers of insulation layers and conductive patterns to be laminated in a wiring structure body are not limited specifically. For example, the embodiments of the present invention may also be applied to a wiring structure body having one insulation layer between conductive pads 105 and heat radiation component 120.

Also, in the above embodiments, it is an option to form a concavo-convex portion on heat radiation component 120 of wiring structure body 10 and on the bottom surface of recess 213 of main wiring board 20 so as to align the heat radiation component with the recess. By so setting, positional shifting is prevented when wiring structure body 10 is mounted on the bottom surface of recess 213 of main wiring board 20. In addition, the heat radiation material may be made of metals or nanocarbon materials instead of a copper-plated layer as described above. For example, in addition to using a copper-plated layer shown in FIG. 4J, the heat radiation material may be formed by laminating a thin metal plate or nanocarbon material or by coating such materials directly on first insulation layer 116 of the wiring structure body. Furthermore, examples of the support plate include a Si plate, an alloy plate and a resin film, which have a low thermal expansion coefficient, and a copper-clad laminate with a carrier.

As semiconductor components such as ICs are becoming more highly integrated, the pitch of their electrodes is getting narrower. Accordingly, multilayer wiring boards for mounting such semiconductor components also have narrow-pitch mounting pads and conductive patterns.

When a semiconductor component mounted on a multilayer wiring board is in operation and generates heat, it is difficult to discharge the heat efficiently from the multilayer wiring board. Accordingly, the generated heat causes a temperature rise in the semiconductor component and may affect the steady operation of the semiconductor component.

A multilayer wiring board according to an embodiment of the present invention exhibits improved heat radiation.

A multilayer wiring board according to one aspect of the present invention includes a main wiring board and a wiring structure body and is structured to mount a semiconductor component to be electrically connected to the wiring structure body. A side of the wiring structure body on which to position a semiconductor component is referred to as one side, and the side opposite the one side is referred to as the other side. The wiring structure body includes multiple conductive pads provided on the one side, a heat radiation component provided on the other side, an insulation layer positioned between the conductive pads and the heat radiation component, and multiple via conductors formed in the insulation layer. The multiple via conductors in the wiring structure body are each formed to have a diameter that increases from the conductive pads toward the heat radiation component.

According to an embodiment of of the present invention, since a heat radiation component is provided in the wiring structure body, heat radiation performance is enhanced in the multilayer wiring board by radiating heat efficiently through the heat radiation component. As a result, heat is efficiently radiated through the heat radiation component when heat is generated during the operation of a semiconductor component electrically connected to the wiring structure body. Also, in the wiring structure body, since diameters of the via conductors increase from conductive pads toward the heat radiation component, the area of via conductors in contact with the heat radiation component is greater than those having diameters that decrease from conductive pads toward the heat radiation component. Thus, heat generated during the operation of a semiconductor component is transmitted promptly to the heat radiation component. Accordingly, the mounted semiconductor component is prevented from being exposed to high temperatures, and its steady operation is thereby secured.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer wiring board, comprising:
a main wiring board configured to mount a semiconductor component on a surface of the main wiring board; and
a wiring structure body mounted to the main wiring board and configured to be electrically connected to the semiconductor component,
wherein the wiring structure body comprises an insulation layer forming a first surface of the wiring structure body on a first side of the wiring structure body, a plurality of conductive pads formed on the insulation layer on the first side of the wiring structure body, a heat radiation component forming a second surface of the wiring structure body on a second side of the wiring structure body on an opposite side with respect to the first side, and a plurality of via conductors formed in the insulation layer such that each of the via conductors has a diameter which increases from the first side toward the second side of the wiring structure body, and the heat radiation component comprises a metal plated layer forming the second surface of the wiring structure body and having a thickness in a range of from 10 μm to 80 μm.

2. The multilayer wiring board according to claim 1, wherein the main wiring board comprises a plurality of main wiring via conductors connected to the via conductors in the wiring structure body and formed such that each of the main wiring via conductors has a diameter which increases in an opposite direction with respect to the diameter of the via conductors in the wiring structure body.

3. The multilayer wiring board according to claim 1, wherein the plurality of conductive pads is embedded into the insulation layer such that the conductive pads have surfaces forming a plane surface with a surface of the insulation layer on the first side.

4. The multilayer wiring board according to claim 1, wherein the insulation layer of the wiring structure body comprises a photosensitive resin material.

5. The multilayer wiring board according to claim 1, wherein each of the conductive pads in the wiring structure body has a thickness of 5 μm or greater.

6. The multilayer wiring board according to claim 1, wherein the wiring structure body comprises a seed layer on which the heat radiation component is formed.

7. The multilayer wiring board according to claim 2, wherein the wiring structure body comprises a seed layer on which the heat radiation component is formed.

8. The multilayer wiring board according to claim 1, further comprising:
an adhesive layer formed between the main wiring board and the heat radiation component such that the adhesive layer is adhering the heat radiation component to the main wiring board.

9. The multilayer wiring board according to claim 1, wherein the main wiring board has a recess portion, and the wiring structure body is positioned in the recess portion of the main wiring board.

10. The multilayer wiring board according to claim 1, wherein the wiring structure body is positioned on the surface of the main wiring board.

11. The multilayer wiring board according to claim 9, wherein the main wiring board comprises a plurality of main wiring via conductors connected to the via conductors in the wiring structure body and formed such that each of the main wiring via conductors has a diameter which increases in an opposite direction with respect to the diameter of the via conductors in the wiring structure body.

12. The multilayer wiring board according to claim 2, wherein the plurality of conductive pads is embedded into the insulation layer such that the conductive pads have surfaces forming a plane surface with a surface of the insulation layer on the first side.

13. The multilayer wiring board according to claim 12, wherein the wiring structure body comprises a seed layer on which the heat radiation component is formed.

14. The multilayer wiring board according to claim 9, wherein the plurality of conductive pads is embedded into the insulation layer such that the conductive pads have surfaces forming a plane surface with a surface of the insulation layer on the first side.

15. The multilayer wiring board according to claim 10, wherein the plurality of conductive pads is embedded into the insulation layer such that the conductive pads have surfaces forming a plane surface with a surface of the insulation layer on the first side.

16. A method for manufacturing a multilayer wiring board, comprising:
forming a plurality of conductive pads on a support plate;
forming on the support plate an insulation layer having a plurality of via conductors such that the insulation layer covers the plurality of conductive pads;
forming a heat radiation component on the insulation layer such that an array of wiring structure bodies is formed on the support plate;
removing the support plate from the array of wiring structure bodies;
cutting the array of wiring structure bodies into a plurality of wiring structure bodies; and
mounting one of the wiring structure bodies to a main wiring board such that the heat radiation component faces the main wiring board, wherein the plurality of wiring structure bodies comprises the insulation layer forming a first surface of the wiring structure bodies on a first side of the wiring structure bodies, the plurality of conductive pads formed on the insulation layer on the first side of the wiring structure bodies, the heat radiation component forming a second surface of the wiring structure bodies on a second side of the wiring structure bodies on an opposite side with respect to the first side, and the plurality of via conductors formed in the insulation layer such that each of the via conductors has a diameter which increases from the first side toward the second side of the wiring structure bodies, and the heat radiation component comprises a metal plated layer forming the second surface of the wiring structure bodies and having a thickness in a range of from 10 μm to 80 μm.

17. The method for manufacturing a multilayer wiring board according to claim 16, wherein the mounting of one of the wiring structure bodies comprises positioning the one of the wiring structure bodies in a recess portion formed in the main wiring board and covering the main wiring board and the wiring structure body with an insulation material.

18. The method for manufacturing a multilayer wiring board according to claim 16, wherein the mounting of one of the wiring structure bodies comprises forming an adhesive layer between the main wiring board and the one of the wiring structure bodies such that the one of the wiring structure bodies is fixed to the main wiring board.

19. The method for manufacturing a multilayer wiring board according to claim 16, wherein the support plate is one of a glass plate, a Si plate and an alloy plate.

20. The method for manufacturing a multilayer wiring board according to claim 16, wherein the forming of the insulation layer on the support plate comprises forming the plurality of via conductors in the insulation layer such that each of the via conductors has the diameter which decreases toward the support plate.

* * * * *